United States Patent
Roy et al.

(10) Patent No.: US 11,844,228 B2
(45) Date of Patent: Dec. 12, 2023

(54) OMNIDIRECTIONAL POLARIZATION INDEPENDENT ALL-DIELECTRIC LIGHT TRAPPING SCHEME

(71) Applicant: University of Central Florida Research Foundation, Inc., Orlando, FL (US)

(72) Inventors: Tania Roy, Orlando, FL (US); Sonali Das, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 179 days.

(21) Appl. No.: 16/598,801

(22) Filed: Oct. 10, 2019

(65) Prior Publication Data

US 2020/0144526 A1 May 7, 2020

Related U.S. Application Data

(60) Provisional application No. 62/756,669, filed on Nov. 7, 2018.

(51) Int. Cl.
 *H10K 30/87* (2023.01)
 *G02B 5/30* (2006.01)
 *H01L 31/108* (2006.01)
 *H01L 31/20* (2006.01)
 *H01L 31/0216* (2014.01)
 (Continued)

(52) U.S. Cl.
 CPC ............. *H10K 30/87* (2023.02); *C01B 33/12* (2013.01); *G02B 5/3008* (2013.01); *H01L 31/02167* (2013.01); *H01L 31/108* (2013.01); *H01L 31/204* (2013.01); *C01P 2004/64* (2013.01); *H01L 31/047* (2014.12)

(58) Field of Classification Search
 CPC ............... H01L 51/447; H01L 31/0543; H01L 31/0547; H01L 31/054; G02B 5/0226; G02B 5/0205; G02B 5/3008; H10K 30/87
 See application file for complete search history.

(56) References Cited

U.S. PATENT DOCUMENTS

| 5,656,098 A * | 8/1997 | Ishikawa ........... H01L 31/02167 136/256 |
| 2012/0060913 A1* | 3/2012 | Grandidier ............. B82Y 30/00 977/773 |
| 2015/0004398 A1* | 1/2015 | Yabuta ..................... B01J 21/08 428/328 |

OTHER PUBLICATIONS

Alnuaimi et al. ("Interface engineering of graphene-silicon Schottky junction solar cells with an Al2O3 interfacial layer grown by atomic layer deposition"), RSC Adv., 2018, 8, 10593-10597.*

(Continued)

*Primary Examiner* — Christina Chern
(74) *Attorney, Agent, or Firm* — Owen G. Behrens; Paul Murty; Smith & Hopen, P.A.

(57) ABSTRACT

A leaf inspired biomimetic light trapping scheme for ultra-thin flexible graphene silicon Schottky junction solar cell. An all-dielectric approach comprising of lossless silica and titania nanoparticles is used for mimicking the two essential light trapping mechanisms of a leaf: (1) focusing and waveguiding and (2) scattering. The light trapping scheme uses two optically tuned layers and does not require any nano-structuring of the active silicon substrate, thereby ensuring that the optical gain is not offset due to recombination losses.

16 Claims, 31 Drawing Sheets
(30 of 31 Drawing Sheet(s) Filed in Color)

(51) Int. Cl.
*C01B 33/12* (2006.01)
*H01L 31/047* (2014.01)

(56) References Cited

OTHER PUBLICATIONS

Oh et al. ("AuCl3 chemical doping on defective graphene layer"), J. Vac. Sci. Technol. A 33, 021502 (2015).*
Ruan et al. ("Flexible graphene/silicon heterojunction solar cells"), J. Mater. Chem A, 2015, 3, 14370-14377.*
Yang et al. ("Synergetic scattering of SiO2 and Ag nanoparticles for light-trapping enhancement in organic bulk heterojunction"), J Nanopart Res (2018) 20:29.*
Definition of "omnidirectional" retrieved from https://www.merriam-webster.com/dictionary/omnidirectional on Oct. 15, 2021.*
Definition of "reside" retrieved from https://www.merriam-webster.com/dictionary/reside on Oct. 15, 2021.*
Shokeen et al. ("Multilayer silver nanoparticles embedded in graded-index dielectric layers"), Optical Materials 66 (2017) 29-34.*
Wang et al. ("High index of refraction nanosphere coatings for light trapping in crystalline silicon thin film solar cells"), Nano Energy (2015) 13, 226-232.*
Yin et al. ("Light absorption enhancement for ultra-thin Cu(In1-xGax)Se2 solar cells using closely packed 2-D SiO2 nanosphere arrays"), Solar Energy Materials & Solar Cells 153 (2016) 124-130.*
Grandidier et al., Light absorption enhancement in thin-film solar cells using whispering gallery modes in dielectric nanospheres. Adv. Mater. 2011. vol. 23: 1272-1276.
Yang et al., Scattering effect of the high-index dielectric nanospheres for high performance hydrogenated amorphous silicon thin-film solar cells. Sci. Rep. 2016. vol. 6: 30503.
Yao et al., Broadband light management using low-Q whispering gallery modes in spherical nanoshells. Nat. Commun. 2012. vol. 3: 664.
Luk'Yanchuk et al., Optimum forward light scattering by spherical and spheroidal dielectric nanoparticles with high refractive index. ACS Photonics. 2015. vol. 2: 993-999.
Ju et al., Graphene/silicon Schottky solar cells: Technical Strategies for performance optimization. Optics Communications. 2018. vol. 428: 258-268.
Huang et al., Replication of Leaf Surface Structures for Light Harvesting. Sci. Rep. 2015. vol. 5: 14281.
Fan et al., Three-dimensional nanopillar-array photovoltaics on low-cost and flexible substrates. Nature Materials. 2009. vol. 8: 648-653.

* cited by examiner

Fig. 3D(i)  Fig. 3D(ii)  Fig. 3D(iii)

0°, λ = 680 nm

0°, λ = 570 nm    0°, λ = 900 nm

OMNIDIRECTIONAL POLARIZATION INDEPENDENT ALL-DIELECTRIC LIGHT TRAPPING SCHEME

CROSS-REFERENCE TO RELATED APPLICATIONS

This nonprovisional application is a continuation of and claims priority to provisional application No. 62/756,669, entitled "Omnidirectional polarization independent all-dielectric light trapping scheme," filed Nov. 7, 2018, by the same inventors, the entirety of which is incorporated herein by reference.

BACKGROUND OF THE INVENTION

1. Field of the Invention

This invention relates, generally, to photovoltaic cells. More specifically, it relates to a light trapping scheme for photovoltaic/solar cells.

2. Brief Description of the Prior Art

With the need for emerging photovoltaic cells to be fabricated on bendable supports and capable of high-speed, roll-to-roll processing, silicon (Si)—the most widely used material in solar cells—is gradually evolving towards a flexible future based on monocrystalline substrates. [1-3]. Flexible monocrystalline silicon photovoltaics will need a paradigm shift in terms of wafer manufacturing, sawing technologies, handling concepts, and encapsulation techniques, along with different contact and junction materials. Atomically thin bodies and the high flexibility of 2D materials make them the logical choice for integration with future-generation silicon photovoltaics technologies. [4-6]. Several important properties of 2D materials stand out in this respect—such as excellent transparency, extraordinary flexibility, and high conductivity. Moreover, the outstanding features of scalability, modularity, and roll-to-roll fabrication enable 2D materials to play a key role in the future of ultra-light photovoltaic technology. [7].

Specifically, the use of graphene (Gr) as a Schottky junction material for silicon solar cells has attracted much attention due to the ease and low cost of fabrication, concomitant with the lucrative properties of high electron mobility, transparency, and mechanical flexibility of graphene as a transparent conducting electrode. [8-12]. In a conventional p-n junction silicon solar cell with high emitter doping ($>10^{18}/cm^3$), Auger recombination dominates over Shockley-Read Hall recombination, reducing carrier lifetime and degrading solar cell performance. [3, 13]. In contrast, a Gr/Si solar cell requires lightly doped silicon to maximize diffusion length and does not suffer from Auger recombination. Also, Gr/Si solar cells do not require elaborate and expensive high temperature diffusion processes that are characteristic of a silicon p-n junction solar cell. [14-15]. Additionally, graphene exhibits extremely low absorbance, and the realization of large area Gr/Si Schottky junction solar cells is possible due to the development of commercially viable roll-to-roll production of graphene and dry transfer techniques based on hot-pressing methods. [16-18]. This paves the way for efficient Gr-based Schottky junction solar cells realized on flexible and ultrathin silicon substrates. [11, 19-20].

For an ultrathin silicon substrate, manipulation of the incoming light, such as collimation, scattering, focusing, and funneling, is needed, which can lead to significant absorption enhancement in the active layer; however, the light manipulation may not take place due to the antireflective coating. In fact, the challenge is two-fold; (a) to optimize a light trapping scheme for enhancing the optical thickness of the material, thereby enabling the utilization of the poorly absorbed solar spectrum in physically thin substrates; and (b) to optimize the physical thickness of the ultrathin silicon substrate on which the light trapping scheme is to be implemented to achieve high values of conversion efficiency.

For the realization of an optimized light trapping scheme, nature has always been a source of inspiration for the scientists. [21]. For harnessing solar energy, the eye of a moth has perhaps been the most mimicked geometry. [22-24]. This is because the eye of the moth can suppress the reflection over a broad range of wavelength and is insensitive to polarization and angle of incidence. Engineering a silicon surface to form nanopillars, nanowires, nanodomes, nanocones, and other engineered structures to resemble the eye of the moth becomes an endeavor to manage the broadband optical characteristics of the front silicon surface and allow more light to couple inside. [25-27]. However, structuring the active silicon substrate to enhance light trapping maximizes the surface area of the solar cell, leading to an increase in surface recombination, which is detrimental to the solar cell efficiency. As such, while such engineered structures increase the optical response of the solar cell, the surface degradation of the cell is such that the optical gains do not translate effectively into electrical gains for the cell.

Additionally, in a Gr/Si solar cell where crumpling, wrinkling, and rippling of graphene transferred on a planar Si surface is inevitable, the effects of these deformations are exacerbated on a structured silicon substrate. [28-29]. These deformations modify the electronic and optical properties of the graphene film, and cause discontinuities in the Gr/Si heterojunction. [29-31]. When graphene is transferred onto a silicon substrate bearing ordered pyramidal pillars, microwrinkles with a height of several micrometers are formed, [32], which reduces solar cell performance. Hence, in the case of a Gr/Si solar cell, a planar Si substrate is preferred over a nanotextured one, despite a planar silicon substrate being highly reflective over the AM1.5G solar spectrum. Thus, it is imperative to use a light trapping scheme devoid of silicon structuring to enhance the photo-conversion efficiency.

Solar cells with plasmonic metal scatterers therefore gained much attention as they offer high polarizability and scattering into the substrate, along with the formation of dipolar resonance. Plasmonic nanoparticles/nanostructures are mainly configured in three ways in thin silicon substrate. [33]. Firstly, the metal nanoparticles can act as light scattering materials when placed on the front surface of the solar cell. Secondly, the nanoparticles can behave as localized surface plasmonic antennas when embedded in the semiconductor producing intense electric field in the near field, resulting in enhanced electron-hole pair generation. Thirdly, metallic nanostructures at the back side of the surface aids in propagating light in the plane of the semiconductor, increasing the light's probability for getting absorbed in the active solar absorber. While all three configurations enable unrivalled light absorption enhancement in the solar absorber, a significant part of this energy is always dissipated due to the ohmic loss, leading to joule heating in metal entities. Therefore, plasmonic losses present a major hurdle in utilizing the energy effectively, necessitating the development of highly efficient solar cells.

To mitigate the disadvantages of incorporating lossy nanoparticle layers in an energy harvesting device like a solar cell, an all-dielectric approach has been considered as the most potential choice of interest. [34]. Dielectric nanospheres supporting Whispering Gallery Modes (WGM) have been the most investigated all-dielectric approach to suppress reflection and enhance absorption into the underlying active absorber. [35-36]. Periodic arrangement of such WGM resonators leads to a coupling of light between the spheres leading to a waveguide formation. However, WGM resonators used for solar cell applications must have a sufficiently low quality factor (Q), low frequency selectivity, and strong in-coupling. [37]. The low Q of WGM resonators is dependent on the bending loss occurring due to the leakage of light which, in turn, depends on the nanoparticle environment. [38-39]. Therefore, to achieve low-Q WGM resonators suitable for photovoltaic applications, it is essential to tune the environment of the WGM resonator, allowing for sufficient leaky channels for the light to couple from the dielectric nanosphere to the underlying silicon. This necessitates the quest to investigate other geometries for light manipulation present in nature in which light is trapped by similar optical phenomena. Instead of drawing inspiration from nocturnal insects, such as the moth, the present invention mimics geometries that capture and manipulate light during the day.

Plants, especially leaves in the plants, are highly efficient in light harvesting. With years of evolutions, leaves have adapted themselves to meet the essential pre-requisite of funneling light energy efficiently and channeling light energy to proper reaction centers to promote photosynthesis. [40]. The present invention described herein includes a leaf-inspired biomimetic light trapping scheme for an ultrathin, flexible solar cell. However, in view of the art considered as a whole at the time the present invention was made, it was not obvious to those of ordinary skill in the field of this invention how to overcome the shortcomings of the prior art.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for an efficient biomimetic light trapping scheme for an ultrathin, flexible solar cell that mimics photosynthetic schemes within plants is now met by a new, useful, and nonobvious invention.

The novel structure includes an omnidirectional, polarization-independent photovoltaic cell and light trapping scheme. The photovoltaic cell includes a planar graphene-silicon solar cell, with a graphene bilayer disposed on top of a silicon substrate that measures approximately 20 µm in height. In an embodiment, the graphene bilayer is p-doped with gold trichloride to increase an open circuit voltage of the photovoltaic cell. The photovoltaic cell may include a layer of aluminum oxide that passivates a planar surface of the silicon substrate, residing between the silicon substrate and the graphene bilayer. The aluminum oxide layer is amorphous and reduced recombination within the photovoltaic cell.

The light trapping scheme includes bilayer of nanoparticles, including a first optically tuned layer residing on top of a second optically tuned layer. In an embodiment, the first optically tuned layer is a plurality of silica nanospheres, and the second optically tuned layer is a plurality of titania nanospheres. The first optically tuned layer includes an associated height, or diameter, that is greater than an associated height, or diameter, of the second optically tuned layer; in an embodiment, the second height is less than half the size of the first height; in a further embodiment, the ratio of the first height to the second height is 6:1. The difference in heights/diameters between the optically tuned layers creates whispering gallery modes within the first layer, causing light entering the first layer to be redirected into the second later with reduced refractory loss.

The novel method of capturing light in a photovoltaic cell in an omnidirectional and polarization-independent way includes a step of coating a graphene bilayer with an amount of gold chloride to dope the graphene bilayer. Titania nanospheres are spin-coated onto the doped graphene bilayer, and silica nanospheres are spin-coated onto the graphene-and-titania substrate. The doped graphene bilayer, including the titania and silica nanospheres, is wet etched, such that the graphene bilayer can be transferred onto a silicon substrate, thereby forming a graphene-silicon photovoltaic cell. The silica nanospheres of the light trapping scheme of the cell receive and capture an amount of light therein. A portion of the light is directed into the titania nanospheres via whispering gallery modes formed within the silica nanospheres, and the portion of light is then directed into the graphene-silicon photovoltaic cell, thereby capturing light energy in the cell.

An object of the invention is to improve the efficiencies and lifespans of flexible solar cells by reducing recombination and refractory losses within the light trapping scheme of the cells.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

The patent or application file contains at least one drawing executed in color. Copies of this patent or patent application publication with color drawings will be provided by the Office upon request and payment of the necessary fee.

For a fuller understanding of the invention, reference should be made to the following detailed description, taken in connection with the accompanying drawings, in which:

FIG. 3D(i) depicts electric field profiles of the light trapping phenomena are shown for angle of incidence of 0° at 680 nm, showing the formation of whispering gallery modes.

FIG. 3D(ii) depicts electric field profiles of the light trapping phenomena are shown for angle of incidence of 0° at 680 nm, showing coupling of light from top layer to bottom layer.

FIG. 3D(iii) depicts electric field profiles of the light trapping phenomena are shown for angle of incidence of 0° at 680 nm, showing light scattering and focusing of light in the active silicon absorber. All profiles shown in FIGS. 3D(i)-(iii) are for TE polarizations and use a linear color scale representing electric field intensity (V/m) within the light trapping structure and silicon for the wavelength of light corresponding to 680 nm.

DETAILED DESCRIPTION OF THE INVENTION

Figure 1A:
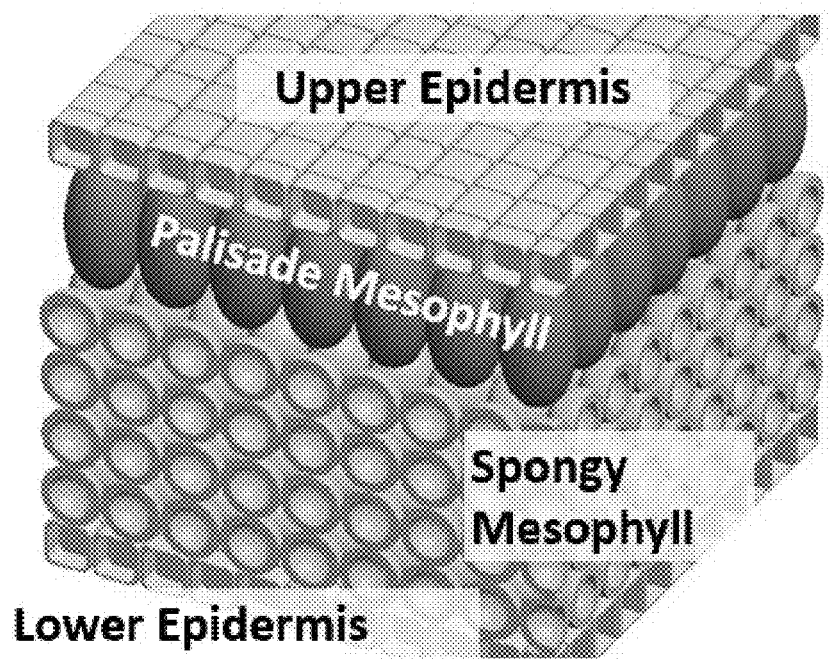
FIG. 1A is a representation of leaf anatomy consisting of upper and lower epidermis, palisade mesophyll and spongy mesophyll.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

The present invention includes a leaf inspired biomimetic light trapping scheme for ultrathin flexible solar cells, such as graphene silicon (Gr/Si) Schottky junction solar cell. The light trapping scheme is all-dielectric lossless hierarchical in nature, omnidirectional and polarization independent. The light trapping scheme is used for mimicking the two essential light trapping mechanisms of a leaf: (1) focusing and waveguiding and (2) scattering. The present invention also includes an improved method of doping a graphene bilayer, as will be described in greater detail below.

As described in greater detail below, experimentation proved that an all-dielectric approach comprising of lossless nanoparticles, for example, lossless silica ($SiO_2$) and titania ($TiO_2$) nanoparticles, mimics the two essential light trapping mechanisms of a leaf: (1) focusing and waveguiding and (2) scattering. The materials used for the nanoparticles are lossless in the solar spectrum, i.e. between 400 nm-1100 nm, but are not restricted to only silica and titania as the tuning can be performed by employing other materials as well (for example, silicon nitride, aluminum oxide, zinc oxide, and other nanoparticles can be used, so long as the nanoparticles are of such a size ratio to mimic the light trapping properties of a leaf). Moreover, the light trapping scheme used two optically tuned layers and did not require any nano-structuring of the active silicon (Si) substrate thereby ensuring that the optical gain was not offset due to recombination losses. Moreover, complete decoupling of the optical and electrical systems enables independent optimization of the light trapping scheme. As will be explained in greater detail below, the ratio of the nanoparticle diameters of the two optical layers plays a crucial role in achieving advanced light management which is omnidirectional, broadband (across the visible spectrum), polarization-independent, anti-reflecting, and more pronounced in the high wavelength regime for light striking at both normal and oblique angles of incidence.

Inspired by light harvesting phenomena in the leaf, an embodiment of the present invention includes a comprehensive novel biomimetic design approach of a light trapping scheme for flexible ultrathin graphene silicon heterojunction solar cell. Three unique properties offered by the leaf inspired light trapping scheme are: (1) it uses an all-dielectric approach, (2) it is devoid of recombination centers since it does not involve silicon surface structuring, and (3) it offers broadband polarization independent reflection characteristics for light striking for normal and oblique angles of incidence.

In an embodiment, the dual-layer (or bilayer) light trapping scheme includes a bottom layer of titania spheres and top layer of silica spheres, with the titania spheres being disposed on planar graphene silicon solar cells. As discussed in greater detail in the Experimental section below, the titania and silica spheres were produced via the Stober technique; however, it is appreciated that the light trapping scheme does not require spherical layers, and other embodiments are contemplated that include non-spherical nanoparticles (such as cylindrical, hemispherical, ovoid, disc-shaped, and other similar shapes). The planar silicon surface is passivated by a layer of aluminum oxide ($Al_2O_3$) and the graphene film is p-doped with gold trichloride ($AuCl_3$). Such simple, low-cost light trapping schemes are universal in nature, devoid of recombination losses and are potentially viable for any solar cell technology. Further, an optimal Si thickness coupled with the optimized light trapping scheme leads to efficient photon-electron harvesting. The photo-conversion efficiency of a 20 μm thick nanosphere decorated Gr/Si solar cell improves to 8.8%, which is 1.3× higher than the pristine cell's photo conversion efficiency (PCE) of 6.8%. Additionally, the photovoltaic characteristic of the laminated solar cell shows negligible change after several bending cycles for bend radii as low as 3 mm. After $10^3$ bending and straightening cycles, the ultrathin solar cell can retain its performance, revealing the excellent stability, reliability, durability, and flexibility of the device.

The key mechanisms behind the interaction of a leaf with light is quite remarkable and hugely depend on the leaf structural components. [41-42]. The propagation of light through the leaves is governed primarily by focusing, funneling, and scattering interactions. FIG. 1A shows a typical schematic of the leaf anatomy consisting of upper and lower epidermis, palisade mesophyll, and spongy mesophyll layers. The upper epidermis is primarily thin and transparent and consists of cellular lens-type cells capable of focusing light. The lens-shaped cells in the epidermis facilitates path length enhancement of the incident light thereby increasing the probability of the injected light to get absorbed along with omnidirectional performance. Palisade cells are generally elongated and are densely packed and consist of the largest proportion of the chloroplasts supporting photosynthesis. This layer enables the penetration of sunlight deep inside the leaf and behaves as waveguide to trap the light. The spongy mesophyll layer consists of irregular cells with large intercellular spaces filled with air. Due to the huge discontinuity between the absorbing material and the air-filled space, there arises a mismatch between the refractive indices in the cellular interfaces. This mismatch helps in scattering the light within the leaf for increasing its chance to get absorbed for photosynthesis.

Figure 1B:
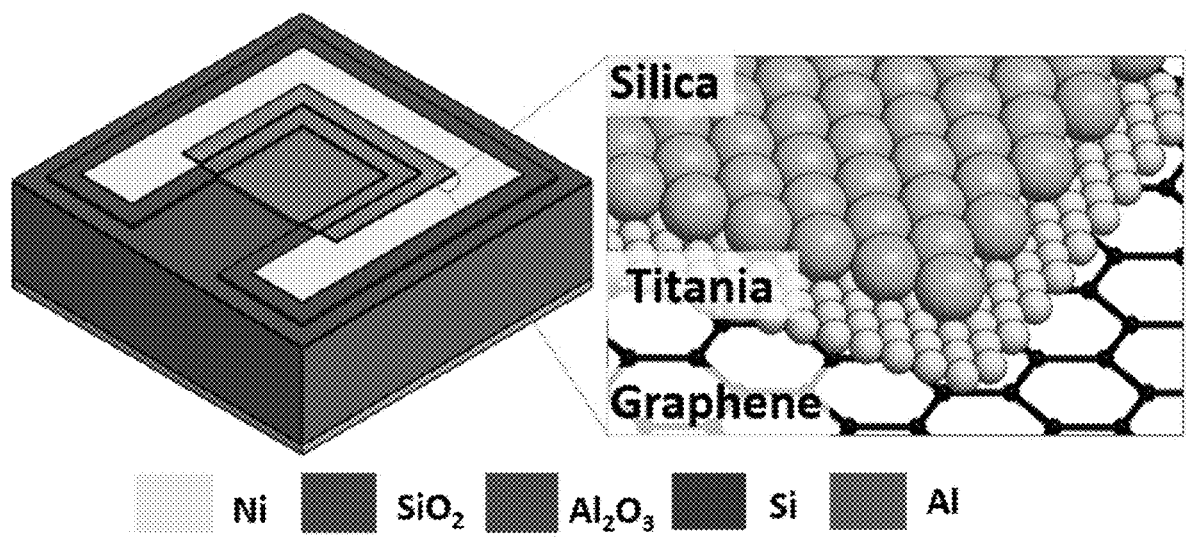
FIG. 1B is a schematic representation of the Gr/Si solar cell with the light trapping scheme.

In a way to exactly mimic the optical behavior observed in the leaf, the present invention includes a unique and novel light trapping scheme for a Gr/Si solar cell. The schematic of the Gr/Si solar cell is shown in FIG. 1B. An interfacial oxide layer of $Al_2O_3$ is deposited on the Si layer to passivate its surface by reducing the recombination centers and to improve the open circuit voltage ($V_{oc}$) of the solar cell. [11, 43]. Bilayer graphene, [44], is then transferred onto the substrate. Although bilayer graphene exhibits a lower transmittance of 95.3% compared to 97.6% transmittance by monolayer graphene, the sheet resistance of bilayer graphene is almost half of that of monolayer graphene, thus offering a tradeoff between electrical and optical performances. [45]. The light trapping scheme as shown in the schematic consists of a bilayer configuration of densely packed hexagonal arrays of titania nanoparticles and silica nanoparticles; however, it is appreciated that other nanoparticles can be used, as described above, so long as the nanoparticles are capable of light trapping implementations. Moreover, while singular layers of titania and silica nanospheres are depicted in FIG. 1B, it is appreciated that multiple layers of nanospheres within one or more of the titania and silica bilayers is contemplated.

Figure 1C:
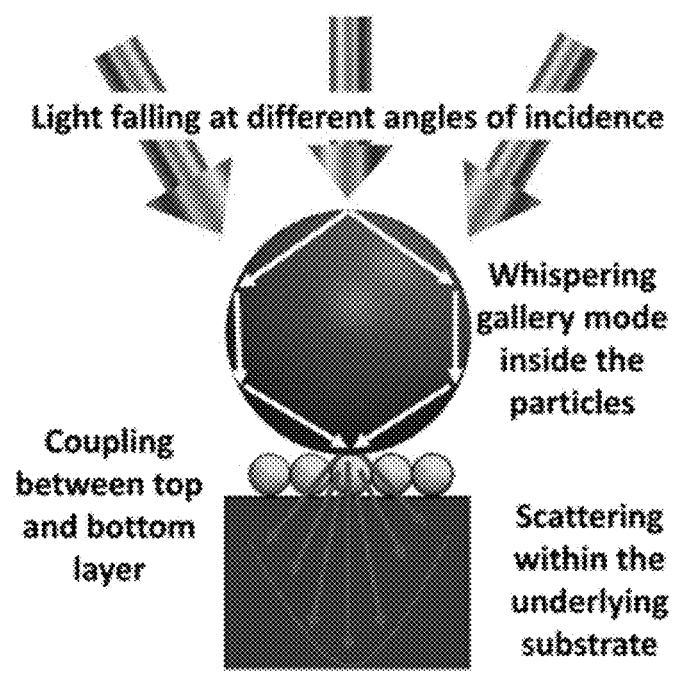
FIG. 1C is a schematic of the light management mechanism in the proposed bilayer light trapping scheme with all-dielectric spheres.

FIG. 1C shows the schematic of the light management mechanism taking place in the proposed bilayer light trapping configuration. The top silica layer, having a greater diameter of the nanoparticles, plays a composite role of focusing and funneling light, similar to the roles provided by the upper epidermis and palisade mesophyll of the leaf. The particles in this layer have circular symmetry and can sustain whispering gallery modes. The light gets confined within the particles by total internal reflection and is trapped by the surface itself until it finds a strong leakage channel provided by the bottom layer. The bottom titania layer, having a smaller diameter of the nanoparticles, offers the role of scattering like the spongy mesophyll layer in leaf. As such, the bottom layer scatters light in the forward direction into the underlying high indexed silicon substrate through the transparent graphene film, while simultaneously reducing back-scattering of the light into the silica layer.

Figure 1D:
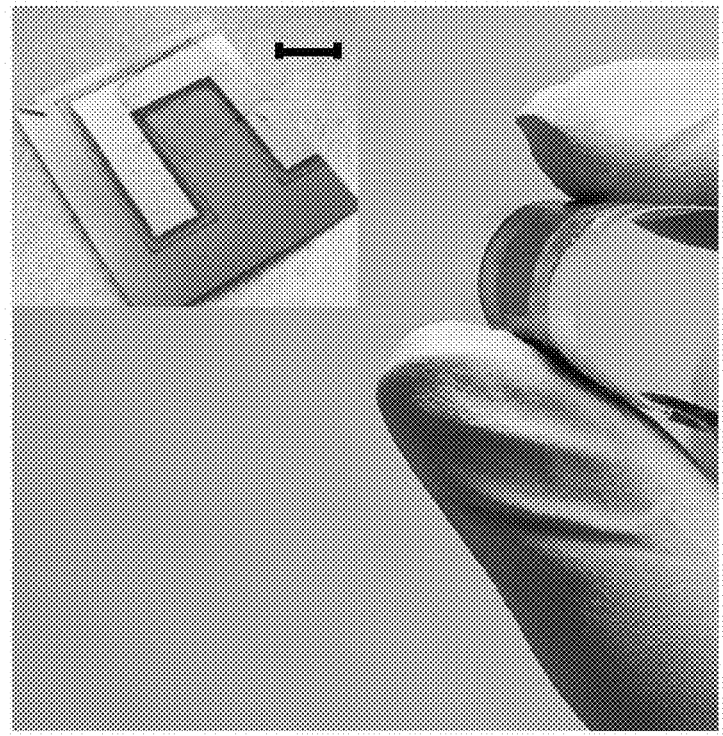
FIG. 1D is a photograph of a flexible thin Gr/Si solar cell. Inset shows the optical image of a complete Gr/Si solar cell. Scale bar 5 mm. The dotted square box indicates the transferred graphene.
Figure 1E:
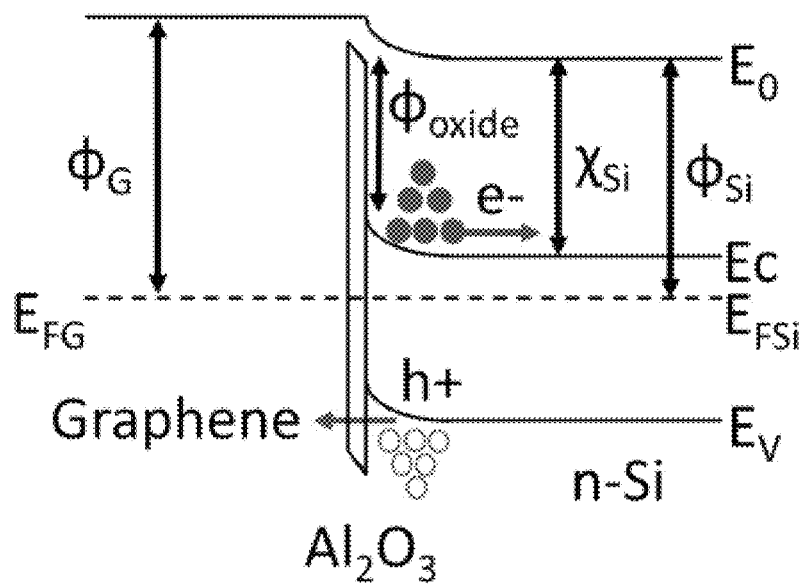
FIG. 1E is an energy band diagram of the Gr/Si Schottky junction.

The size of the silica nanoparticles in the top layer and the size of titania nanoparticles in the bottom layer play a crucial role for guiding and propagating the light in a manner like that observed in the leaf. For example, in an embodiment, the diameter of the titania layer nanoparticles is less than half the diameter of the silica layer nanoparticles, as will be discussed in detail below. FIG. 1D shows the optical image of a representative Gr/Si solar cell. FIG. 1E shows the energy band alignment at the doped Gr/Si interface under illumination with an $Al_2O_3$ passivation layer between graphene and Si. Graphene forms a Schottky barrier with n-Si because of the difference between the work function of graphene ($\Phi_G$) and that of silicon ($\Phi_{Si}$). The $Al_2O_3$ passivation interlayer between graphene and Si improves the efficiency of Gr/Si heterojunction solar cells. The oxide layer serves as a barrier to the recombination of generated electrons and holes. The generated holes are collected by the graphene layer as they tunnel through the $Al_2O_3$ barrier. A high barrier height ($\Phi_{oxide}$) is desired for preventing the tunneling of electrons through the passivation layer. An optimal thickness of 5 Å-30 Å of $Al_2O_3$ helps improve the photo conversion efficiency (PCE) of the solar cell by allowing efficient hole tunneling and improving the $V_{oc}$ by reducing carrier recombination. Rather than being comprised of spherical structures, the $Al_2O_3$ layer is amorphous. The p-doping of graphene enhances the Gr/Si Schottky barrier, resulting in higher $V_{oc}$. Simultaneously, doping graphene reduces the series resistance of the solar cell, thus improving the fill factor (FF).

Figure 2A:
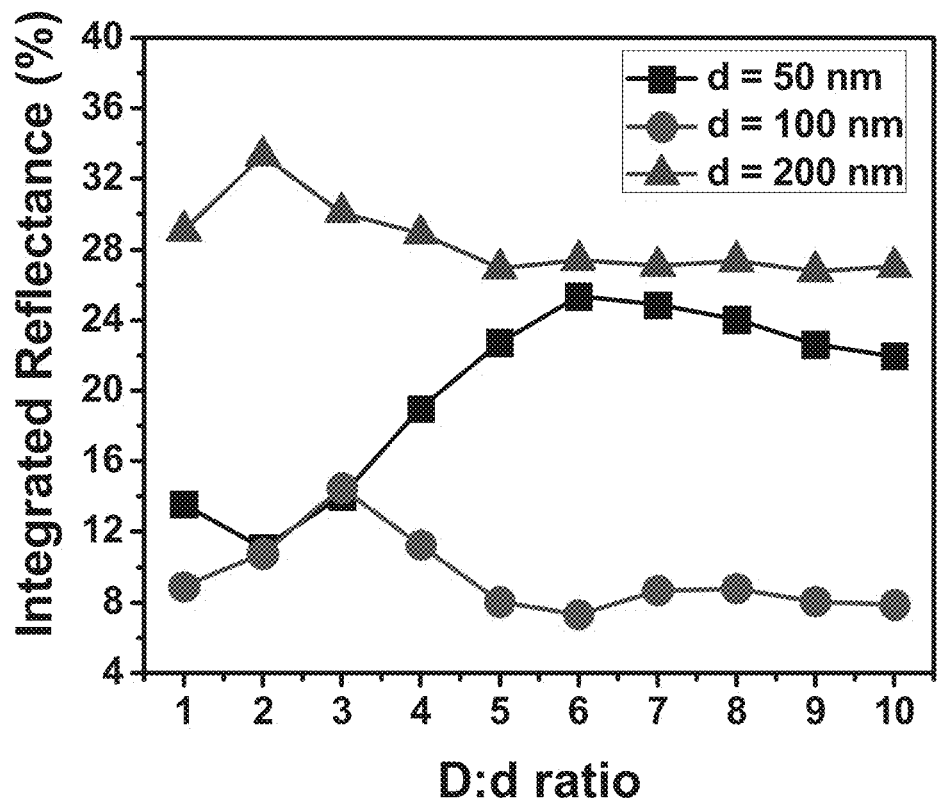
FIG. 2A is a graph of the finite-difference time-domain (FDTD) optimization of the light trapping scheme for 20 μm thick silicon substrate with graphene on top.
Figure 2B:
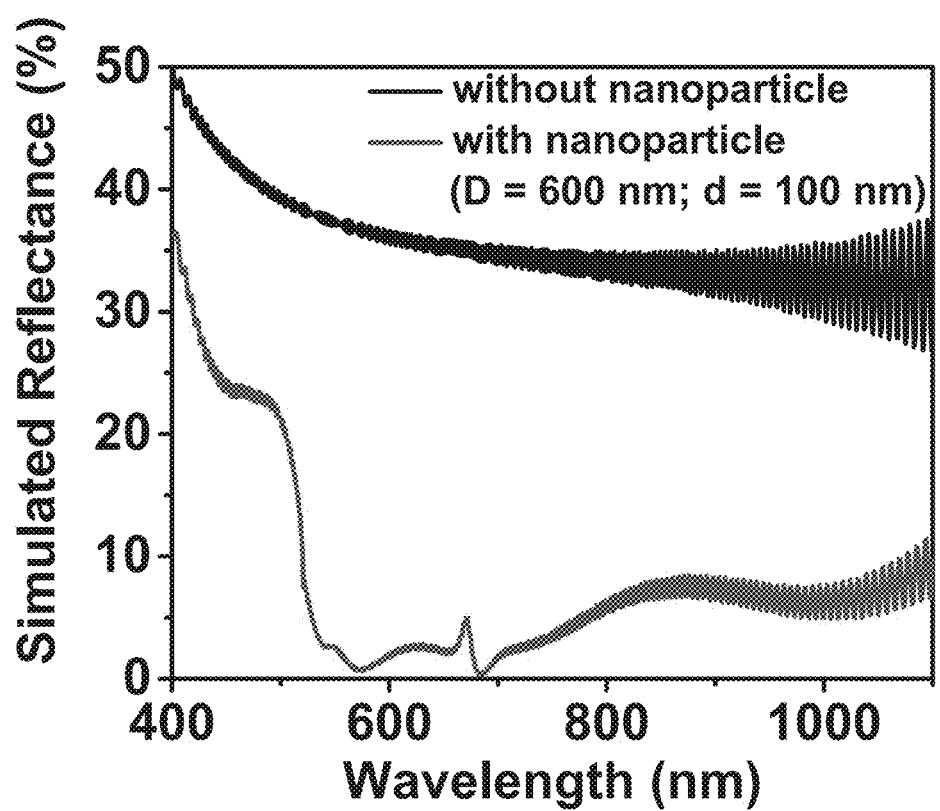
FIG. 2B is graph of wavelength dependent reflectance of the optimized combination of the nanoparticles in the light trapping scheme.
Figure 6A:
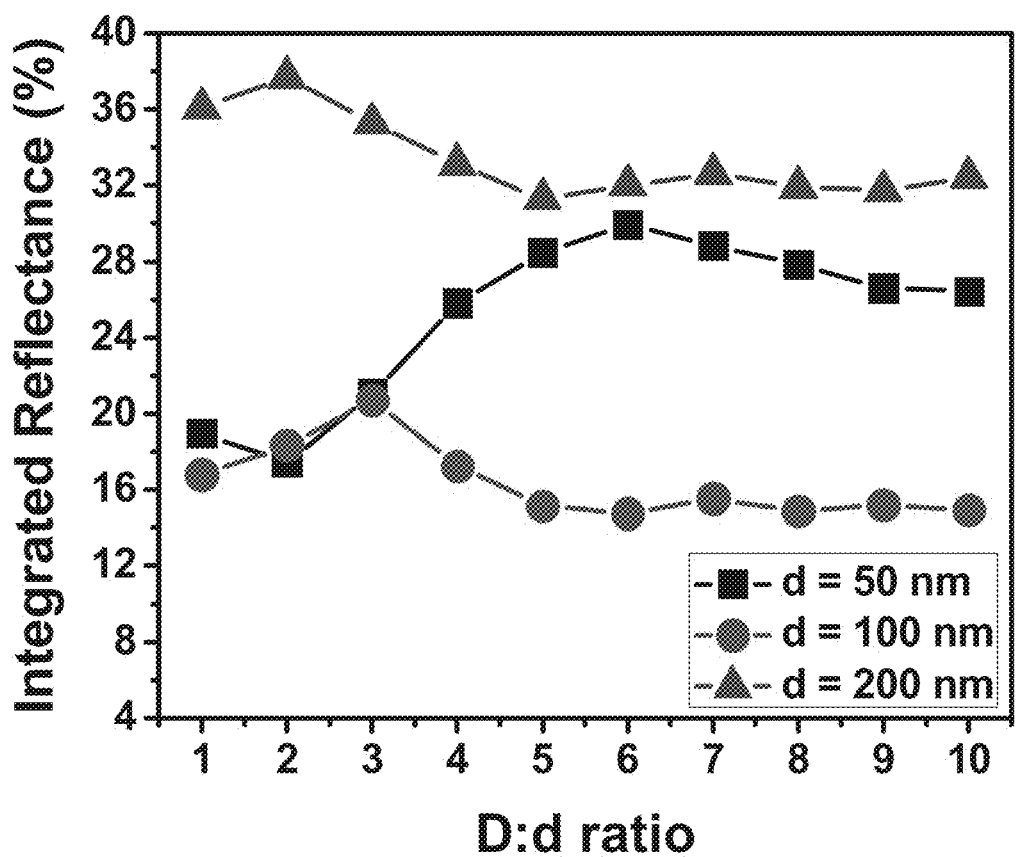
FIG. 6A is a graph of FDTD light pattern optimization of the light trapping scheme for a 10 μm thick silicon substrate with graphene on top.
Figure 6B:
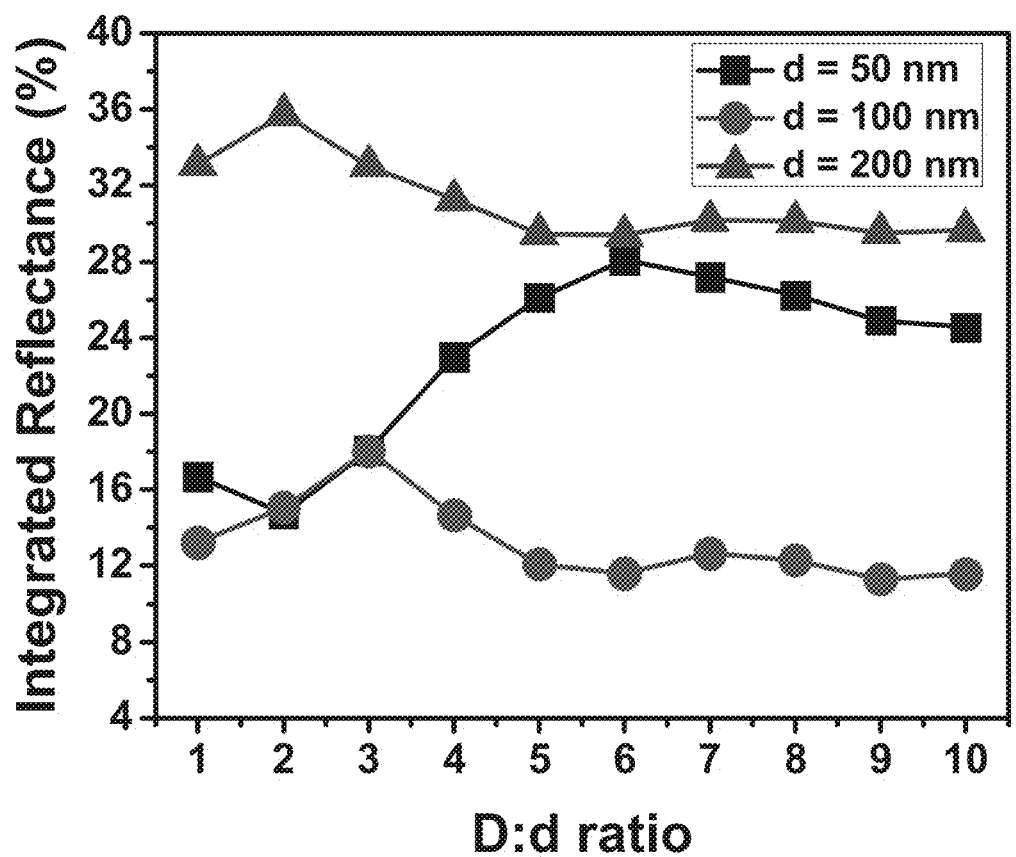
FIG. 6B is a graph of FDTD light pattern optimization of the light trapping scheme for a 15 μm thick silicon substrate with graphene on top.

To maximize the photon-electron harvesting and to minimize the optical reflectance, a synergistic association of the light trapping scheme and the thickness of the underlying silicon is required. 3D full field electromagnetic simulations were executed with simulation software marketed under the trade name LUMERICAL® FDTD Solutions to predict the size of the nanoparticles for the all-dielectric bilayer light trapping scheme for an optimized silicon substrate. Substrates cannot be too thick from material usage and cost point of view. The substrates also cannot be too thin as they will suffer from reduced absorption of photons even with optimal light trapping structures. To perform the optimization, the light trapping scheme with different ratio of diameters of silica (D) to titania nanoparticles (d) for d=50 nm, 100 nm and 150 nm was simulated (i.e., ratios varied from 1 to 10 for each value of d, with D varying from 50 nm to 2 μm). The integrated reflectance ($R_{int}$) is calculated using the following equation:

$$R_{int} = \frac{\int_{\lambda=400\,nm}^{1100\,nm} R(\lambda)N_0(\lambda)d\lambda}{\int_{\lambda=400\,nm}^{1100\,nm} N_0(\lambda)d\lambda} \tag{1}$$

where $N_{0(\lambda)}$ is the number of photons for the incident AM1.5G solar spectrum and $R(\lambda)$ is the reflectance corresponding to wavelength $\lambda$. The integrated reflection due to the incorporation of the light trapping scheme on Gr/Si for a constant silicon thickness (20 μm) has been plotted in FIG. 2A. The optimization has been also carried out for different thicknesses of silicon (10 μm and 15 μm), which is depicted in FIGS. 6A and 6B. The objective was to minimize the integrated reflectance which is controlled by the diameters of the silica and titania nanoparticles along with the optimum silicon thickness. As compared to other thicknesses, it is observed that for a ratio of D:d of 6 at d=100 nm, i.e. when D=600 nm and d=100 nm, $R_{int}$ reaches a minimum value for a 20 μm thin silicon substrate. As such, a diameter (or height) ratio of 2:1, and particularly of about 6:1, between the silica nanoparticles and the titania nanoparticles results in reduced $R_{int}$ values, as shown particularly in FIG. 2A. In addition, it is appreciated that variations in volume can contribute to the desired ratios between the components of the bilayer. FIG. 2B shows the wavelength-dependent reflectance for 20 μm silicon substrate in presence and absence of the optimized light trapping structure.

Figure 2C:
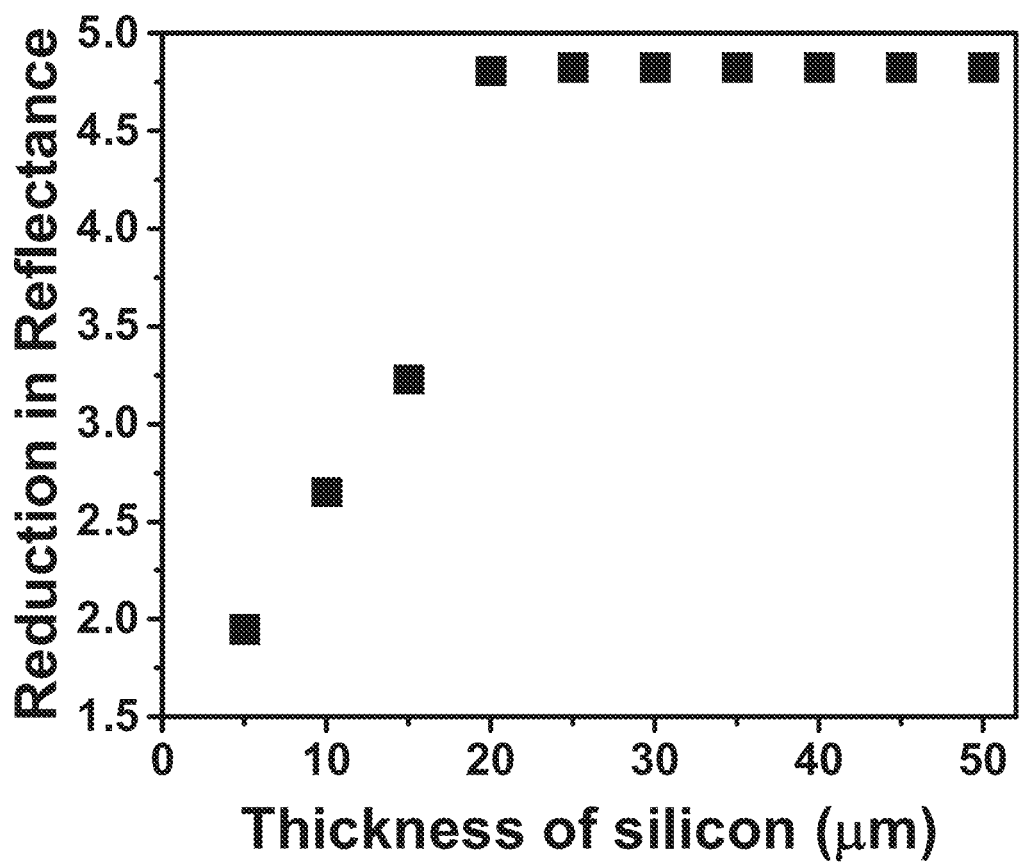
FIG. 2C is a graph of integrated reflectance as a function of thickness of silicon for the optimized light trapping structure (D=600 nm, d=100 nm) on Gr/Si interface.
Figure 6C:
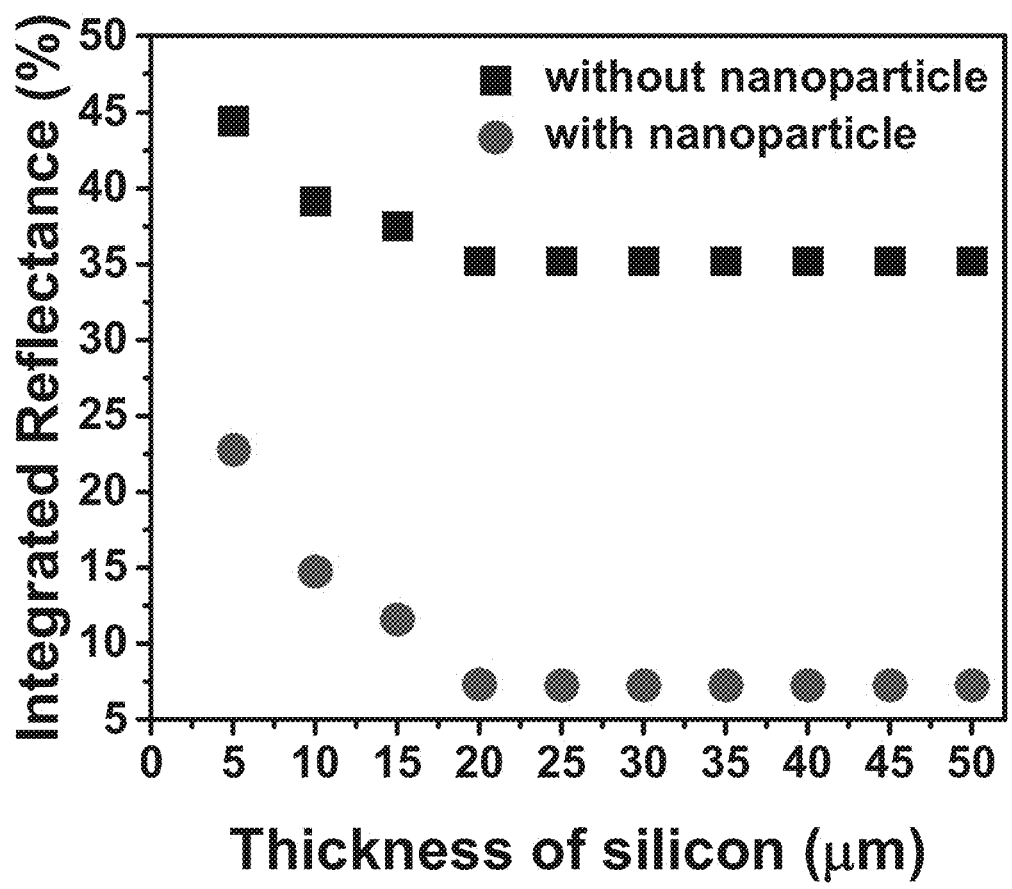
FIG. 6C is a graph of the Integrated Reflectance from the Gr/Si interface with and without the optimized light trapping structure for different thicknesses of silicon.

It is seen that the reflection characteristic is ultra-low as well as broadband in nature, clearly depicting significant reduction in reflectance of the light trapping structured solar cell compared to the bare one. The reflectance remains below 3% for the spectrum ranging from 540-740 nm resulting in the integrated reflectance of ~7.32% for the entire solar spectrum (400-1100 nm). This constitutes ~80% reduction in reflectance compared to a bare Gr/Si surface with the silicon of same thickness. Further based on this optimized pattern, wavelength integrated reflectance of Gr/Si as a function of silicon thickness is studied. FIG. 2C shows the reduction in reflectance as calculated by the ratio of $R_{int}$ of bare Gr/Si to $R_{int}$ of silicon with the optimized light trapping scheme for different substrate thickness. The factor rises when the thickness of silicon increases and is found to be saturated to a value of 4.8 for the silicon thickness equal to and greater than 20 μm. This clearly evidences the fact that the absolute reflectance with and without the light trapping scheme does not change beyond this point, which is depicted in FIG. 6C.

For substrate thicknesses beyond 20 μm, the substrate already has the capability to absorb most of the incident photons, but with high reflection loss. In such cases, a simple optimized antireflection coating will serve the purpose of reducing the reflection losses, rather than the need for an advanced light management scheme. The thickness of silicon equal to 20 μm defines a key transition point for the nanoparticles to play the role of antireflection properties or advanced light management scheme for the underlying silicon.

Evaluation of the optoelectronic performance of the solar cell should be considered for unconventional incidence of light and variation of light polarization. Irrespective of normal incidence of light, solar cells must also harness energy in 'out of the way' conditions when the angle of incidence changes. This happens on a cloudy day with diffused radiation, and mostly due to the movement of sun from east to west in a day, northern hemisphere to southern hemisphere in a year. Since the resonators in the top layer of the optimized bilayer scheme supports excited resonance modes, it is often found that resonances are polarization sensitive [61, 62]. Accordingly, in-coupling was monitored not only as a function of the angle of incidence and excited wavelengths, but also for transverse electric (TE) and transverse magnetic TM polarization of instance.

Figure 3A:
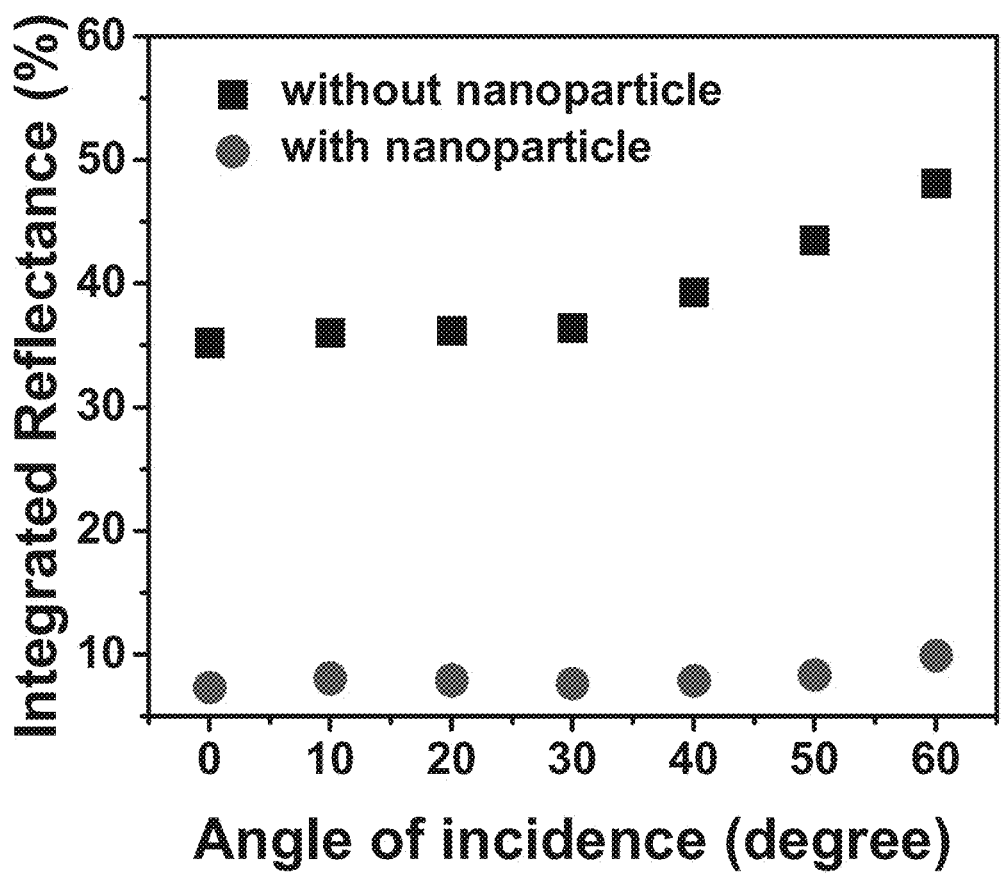
FIG. 3A is a graph of the angle dependent wavelength integrated reflectance of the optimized light trapping structure coated Gr/Si. The bare substrate response is also depicted in the graph.

As noted above, the light trapping scheme of the present invention possesses an outstanding broadband and omnidirectional reflectance over a wide angle of incidence. The integrated reflectance of the optimized combination of the nanoparticles with varying angles of incidence is simulated, as shown in FIG. 3A. The integrated reflectance ($R_{int}$) at normal incidence is ~7% and it degrades very slightly with increasing angle of incidence. The $R_{int}$ increases by only ~5% as the angle of incidence is increased to 30° and ~14% at an angle of 50°. In comparison, the bare substrate without the light trapping scheme shows ~35% reflectance for normal incidence, which gradually increases to ~50% at an angle of incidence of 60°. The $R_{int}$ for varying angles of incidences is the averaged response of two guided modes of excitations at those angles and involved the simulations of the TE and TM polarized incident light:

$$R_{int} = \frac{R_{TE}(\lambda) + R_{TM}(\lambda)}{2} \quad (2)$$

Figure 3B:
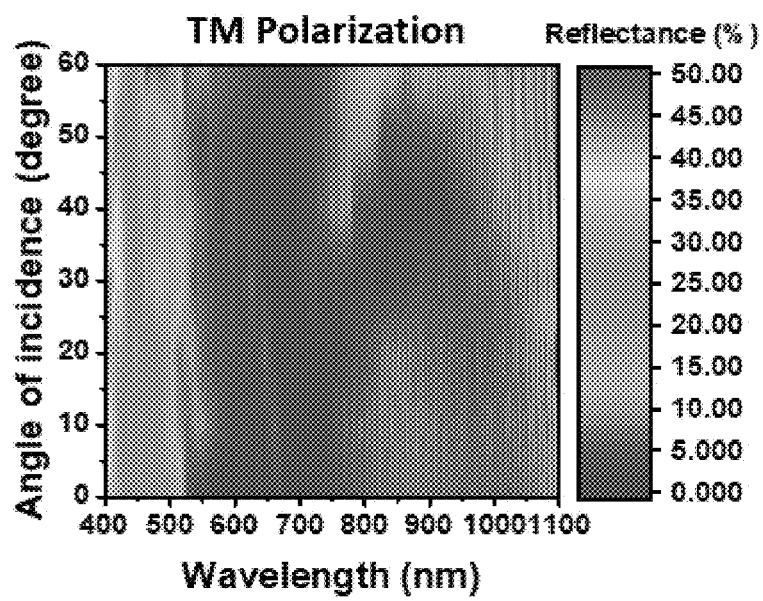
FIG. 3B is graph of reflectance as a function of wavelength and angles of incidence of light for the optimized light trapping structure for transverse magnetic (TM) polarized incident light.
Figure 3C:
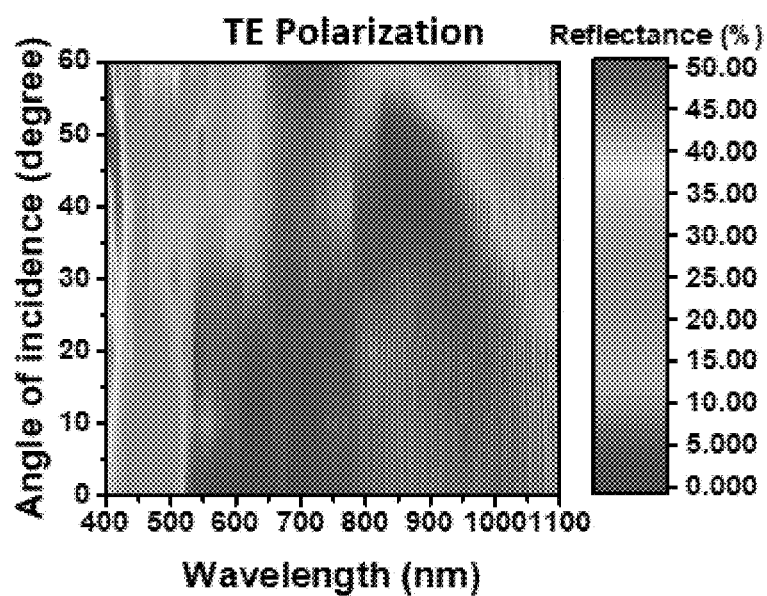
FIG. 3C is graph of reflectance as a function of wavelength and angles of incidence of light for the optimized light trapping structure for transverse electric (TE) polarized incident light.
Figure 7A:
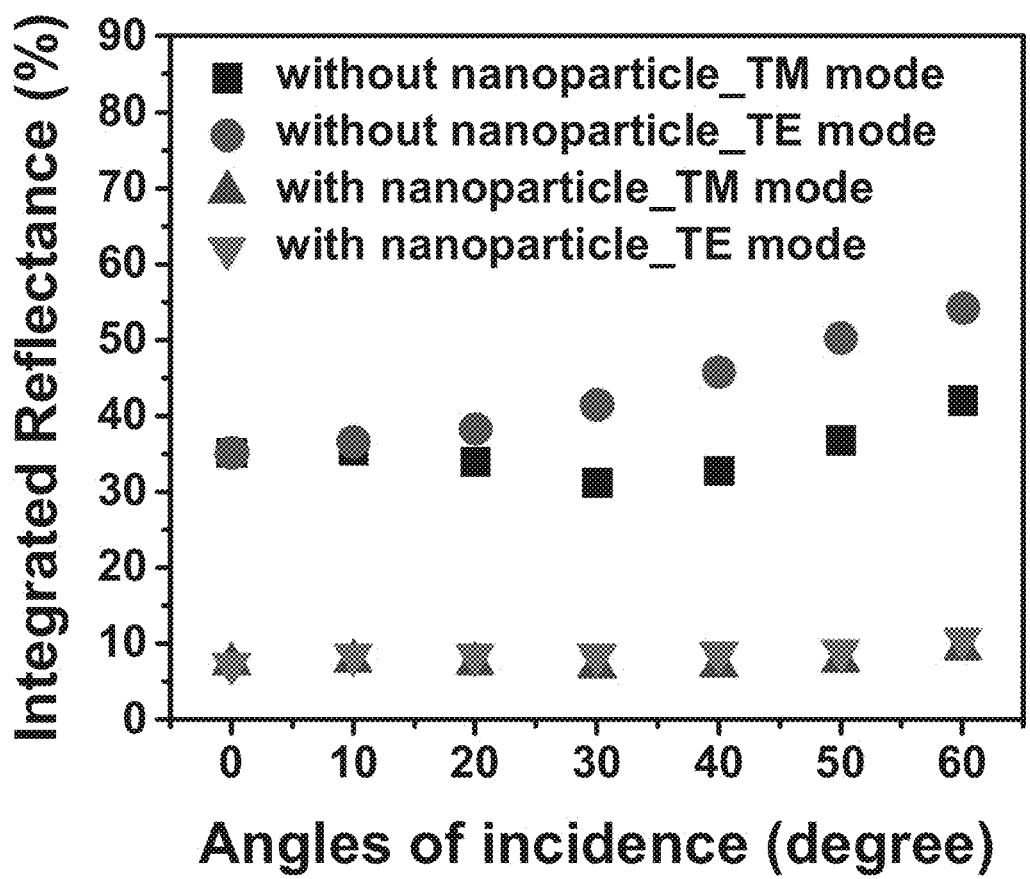
FIG. 7A is a graph of angles of incidence vs integrated reflectance of Gr/Si cell with and without the light trapping structure for TE and TM polarization.
Figure 7B:
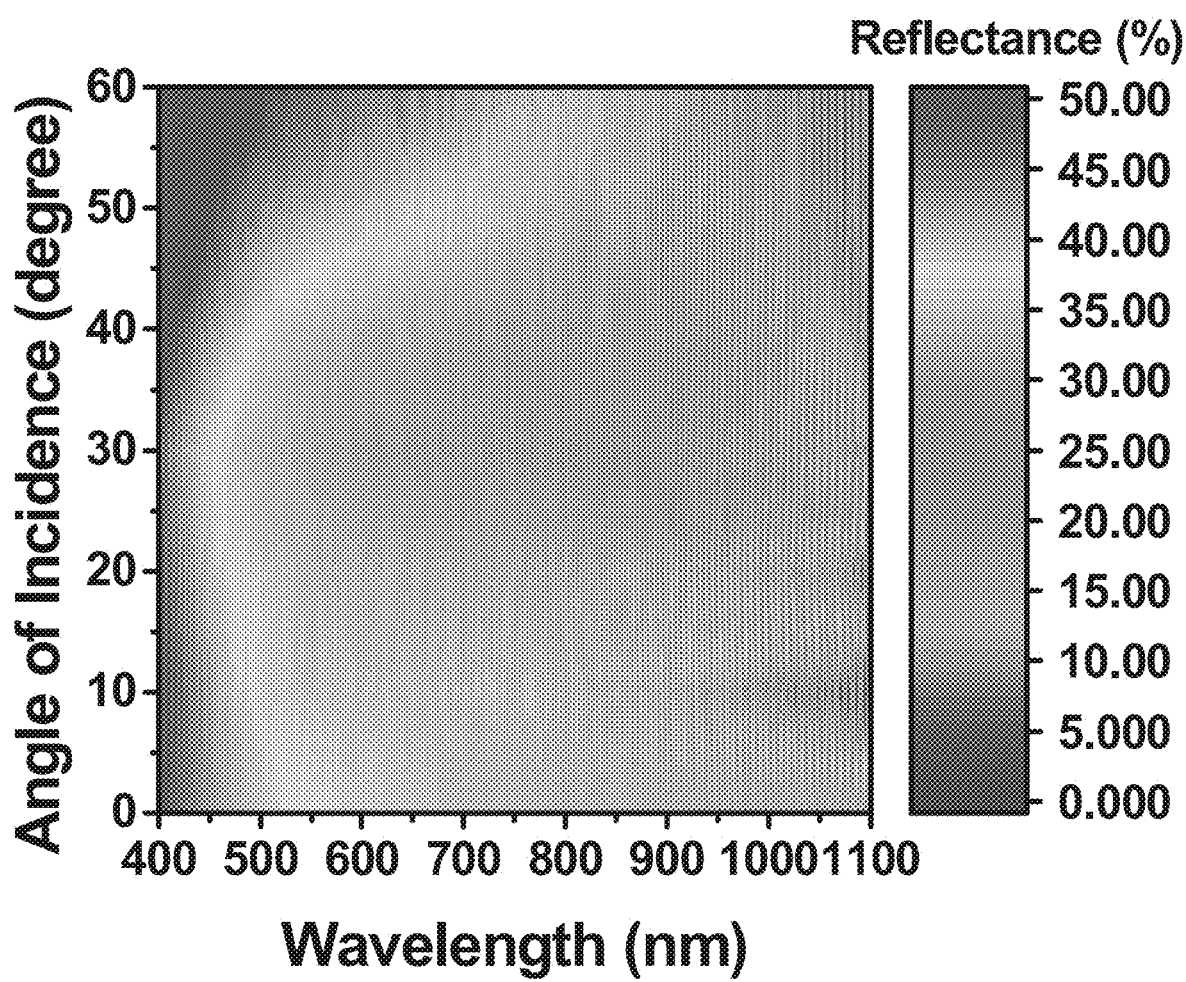
FIG. 7B is a graph of reflectance as a function of wavelength and angles of incidence of light for the bare Gr/Si structure for TM polarized light.
Figure 7C:
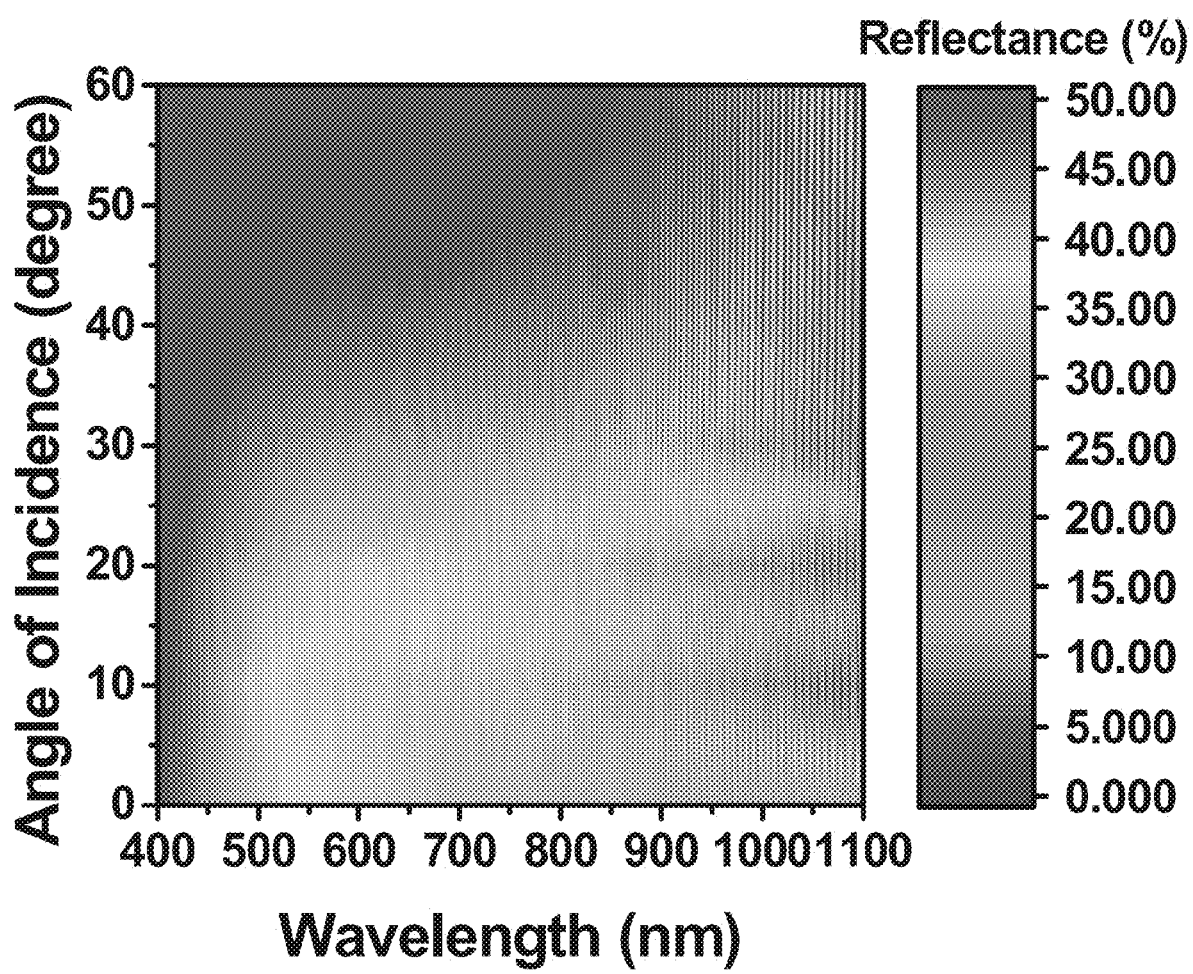
FIG. 7C is a graph of reflectance as a function of wavelength and angles of incidence of light for the bare Gr/Si structure for TE polarized light.

Upon analyzing the individual simulations excited by TE and TM mode incident light separately, the integrated reflectance remains unaffected as compared to the silicon having no light trapping scheme. This is affirmative of the fact that the proposed light trapping scheme can achieve polarization independent response for wide angles of incidence, which is depicted in FIG. 7A. FIGS. 3B-3C show the contour plots of the wavelength-dependent reflectance of the light trapping scheme on Gr/Si (20 μm) for TE and TM mode of excitation, respectively, with varying angles of incidence. The composite behavior of the two layers helps in suppressing the reflectance from the substrate for both the modes of excitation, not only for the entire solar spectrum, but also at higher angles of incidence, as compared to the bare silicon, which is evidenced in FIGS. 7B and 7C.

To elucidate the light management phenomenon taking place in each layer of the optimized structure, the electric field profiles are shown for normal incidence and at an angle of incidence of 60° (FIGS. 3D(i)-3F). FIGS. 3D(i)-3D(iii) show the light trapping mechanism at a wavelength of 680 nm for normal incidence of light. The effect of whispering gallery modes, leaky channel effects, and scattering within the substrate has been demonstrated for this wavelength by simply scaling the value of the electric field intensity. Spherical silica nanoparticles having higher refractive index (1.46) than the surrounding medium (refractive index of air=1) can support whispering gallery modes within them (FIG. 3D(i)).

Upon entering the nanoparticle, light gets confined within the nanoparticle due to its spherical geometry. All subsequent angles of incidence for the light striking the internal surface are same and are greater than the critical angle of 430° defined by the silica/air interface. This causes light to travel close to the inner edges of the sphere due to total internal reflections at the silica/air interface. These conditions for total internal reflection are not only supported for normal angle of incident light but also for oblique angles.

Figure 8A:
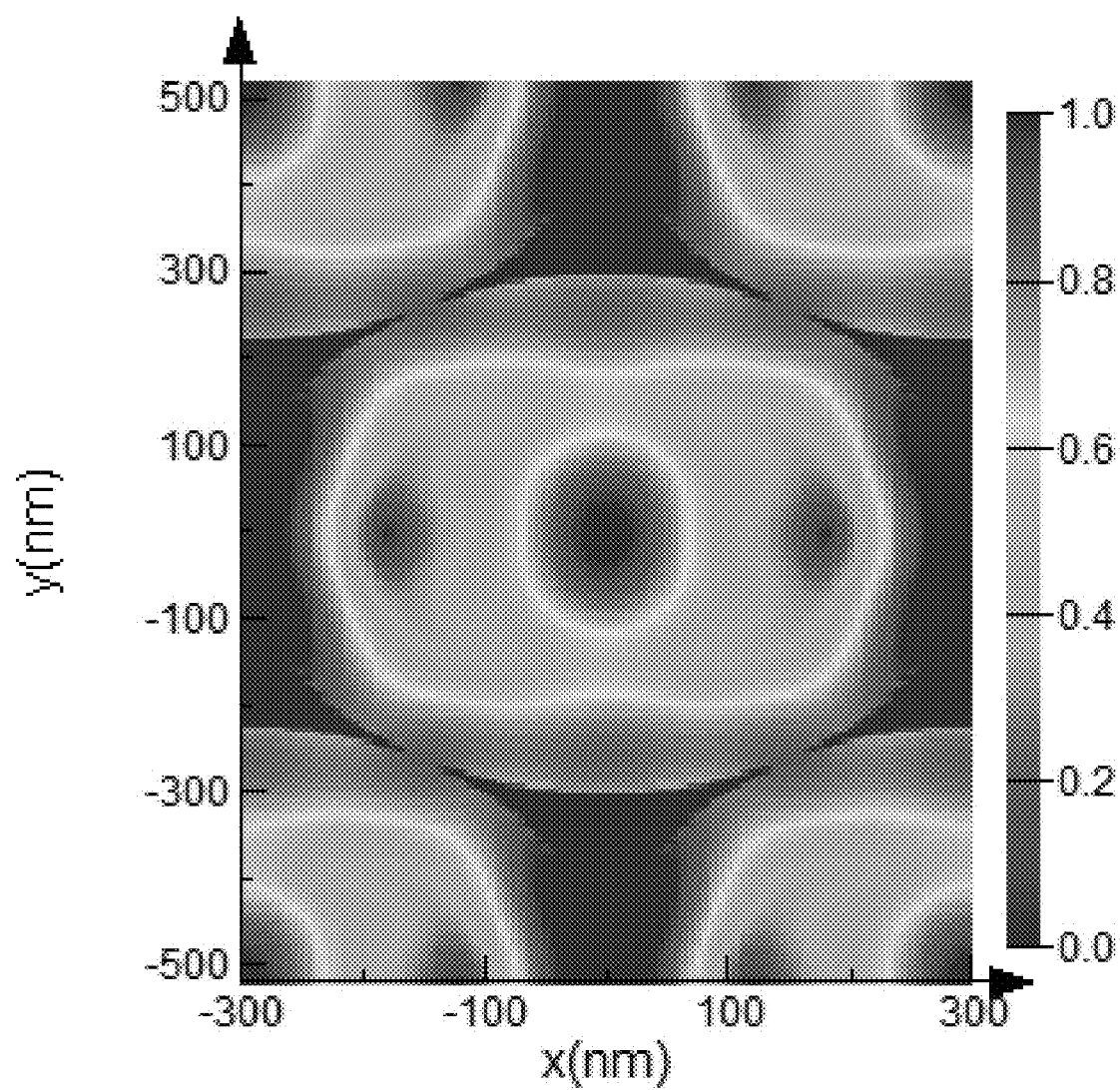
FIG. 8A is an electric field profile in an XY plane showing the formation of WGM modes at 400 nm.
Figure 8B:
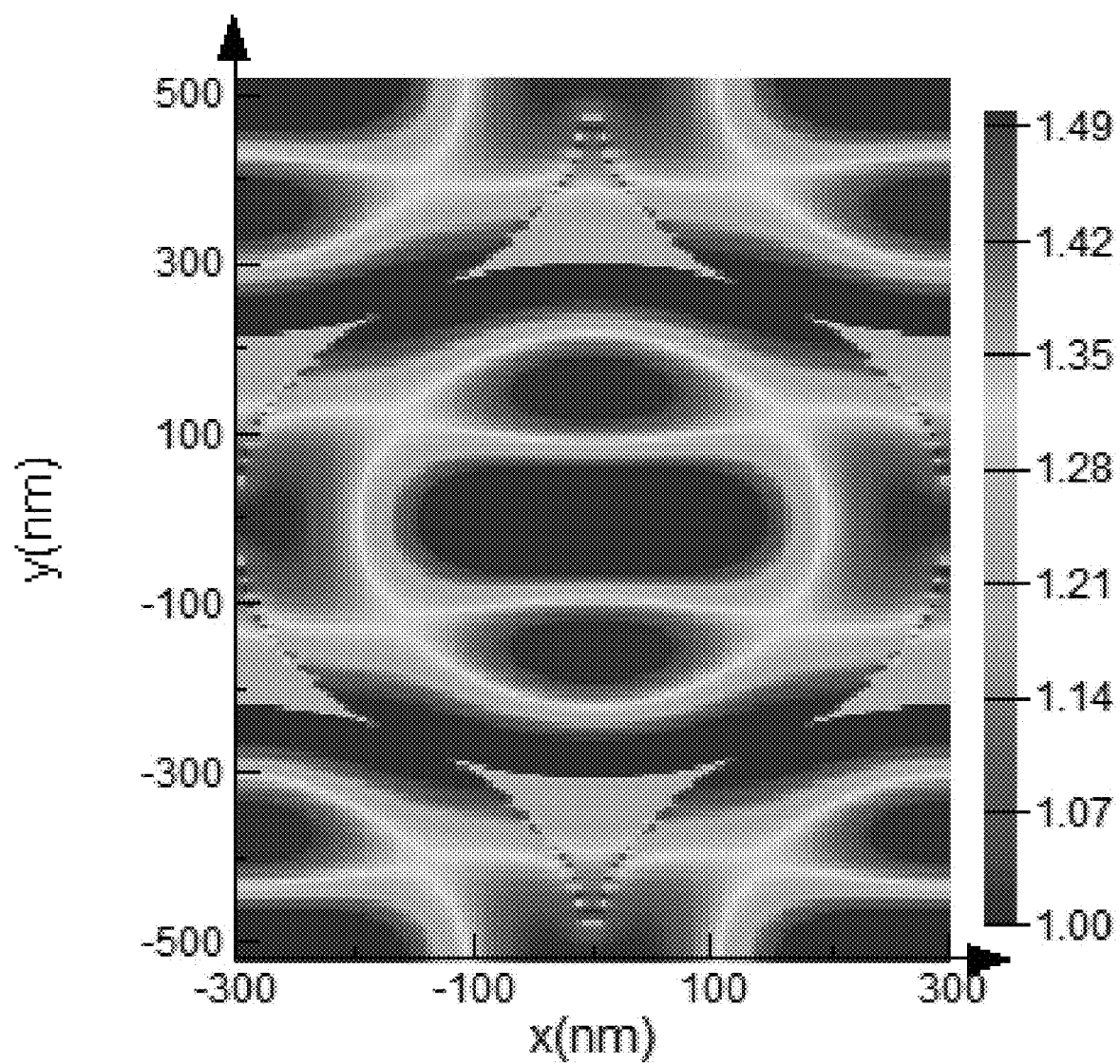
FIG. 8B is an electric field profile in an XY plane showing the formation of WGM modes at 680 nm.
Figure 8C:
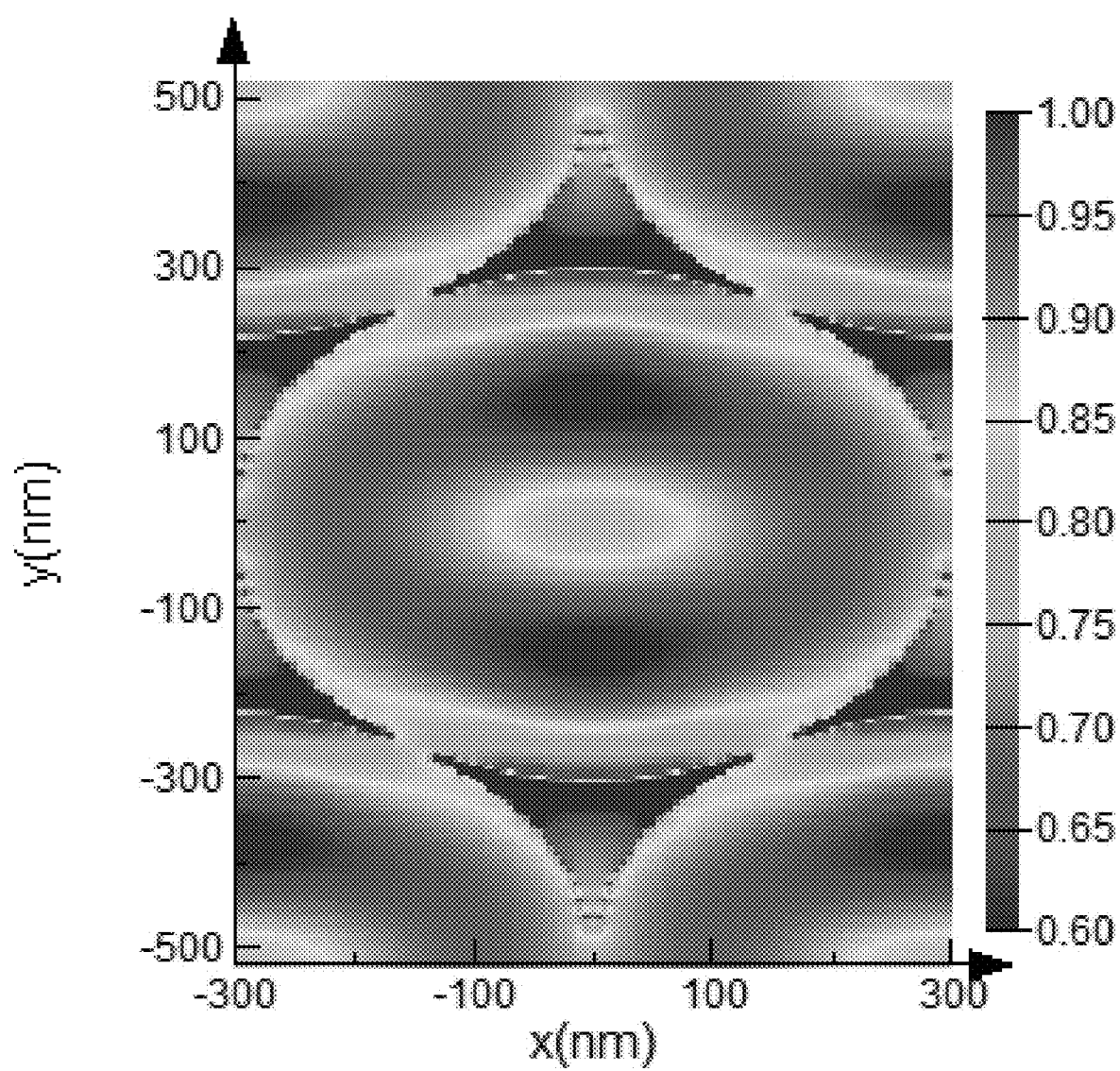
FIG. 8C is an electric field profile in an XY plane showing the formation of WGM modes at 720 nm.

FIGS. 8A-8C show electric field (E-field) profiles in XY planes at the center of the silica nanoparticles displaying other WGMs formed at wavelengths corresponding to 400 nm, 680 nm, 720 nm. As shown, there is sufficient intra layer interaction which allows for better light trapping specially at higher angles of incidence. This light interaction between dielectric spheres supporting WGM can also be envisaged as a photonic nanojet. [46]. After the light propagates along the surface for one round trip with the same phase, there arises a possibility of formation of constructive interference satisfying the resonance condition of:

$$\frac{2\pi \times \text{Radius of sphere}}{\text{Wavelength of interest}} = \frac{l}{\text{Refractive index of sphere}} \quad (3)$$

where l is an integer corresponding to the number of round trips for any wavelength. [47-49].

According to equation (3), and assuming the absence of any leaky mode from the sphere, the silica spheres of optimized diameter (600 nm) can guide the light in a round trip ~9× for a light of wavelength 300 nm, ~4.5× for the light of wavelength 600 nm and ~2.5× for the light having wavelength 1100 nm. The number of round trips decreases for each wavelength when the size of the nanoparticle decreases, underlining their incapacity to support WGMs for the entire solar spectrum. This is evident from the integrated reflectance for the optimizations carried out, as evidenced in FIGS. 2A and 6A-6B, which show inferior performance for lower values of the D:d ratio for a particular value of 'd'. This hinders the reduction of the size of the nanoparticles placed in the top layer of the proposed structure. Further, for higher values of the D:d ratio, the reflectance is found to be asymptotic which is indicative of the presence of WGM in the top nanoparticle layer.

However, as the primary objective of the light trapping scheme is to couple light into the silicon substrate, it is not merely enough to trap the light via WGMs. The trapped light should be leaked preferentially towards the substrate through suitable leakage channels. This leakage performance of such resonating spheres can be well judged by the Quality (Q) factor, which is defined as $$Q = \omega_0 \frac{\text{Stored energy}}{\text{Power loss}} = \omega_0 \tau \quad (4)$$

where $\omega_0$ represents the angular frequency of the resonator and τ is the time required for the field to decay by a factor of e. [50].

Figure 8D:
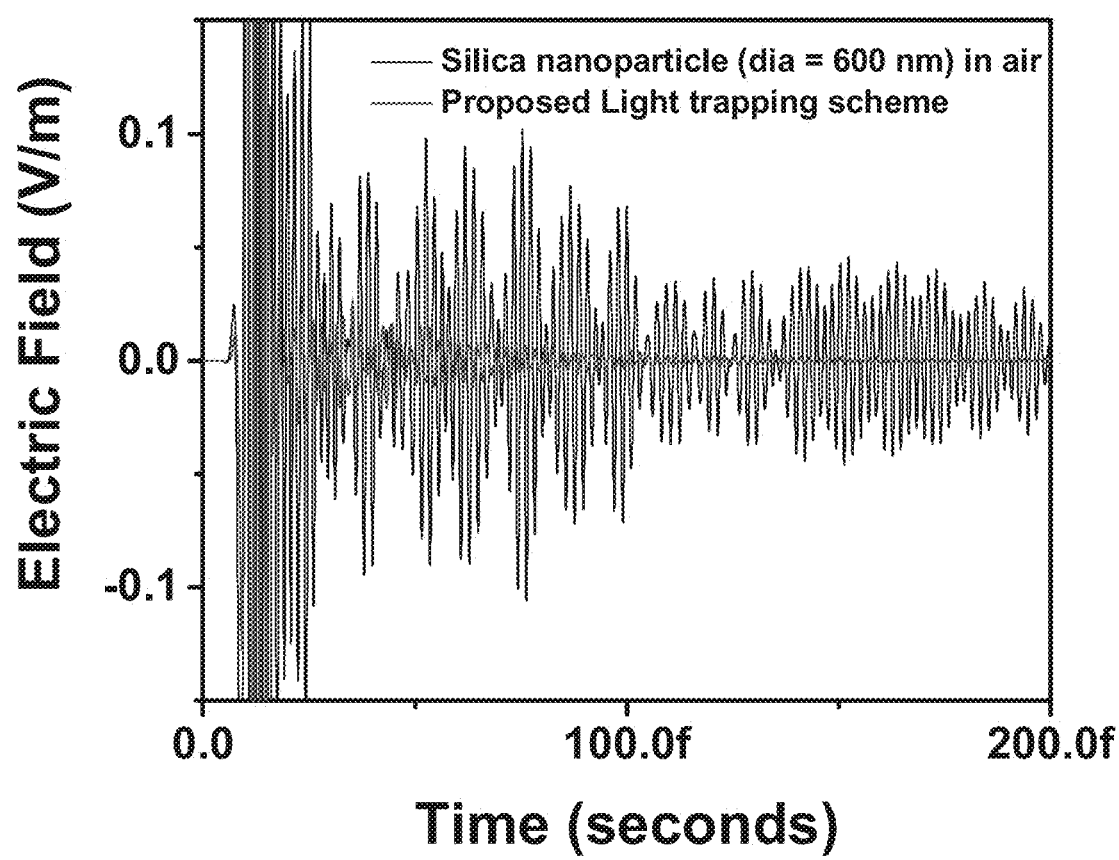
FIG. 8D is a plot of the decay of an electric field with time, compared to the low Q value in the present invention with complete decay, compared to a high Q value in an array of silica nanoparticles in air where the electric field does not decay by the end of simulation.

The Q-factor measures the characteristic time for the natural (exponential) decay of the energy stored inside the silica sphere resonators and is the ratio of the total energy stored to the energy dissipated by the resonator. From a material property standpoint, the Q-factor depends on the ratio of phase constant and intensity attenuation coefficient of the resonator and is therefore inversely proportional to the absorption of the resonator. Because of the lossless nature of the dielectric spheres, all-dielectric resonating spheres can support a high Q-factor in the solar spectrum. While ideal lossless photonic-bandgap Fabry Perot resonators are capable of a Q-factor in the order of $10^5$, the Q-factor reduces in the order of $10^3$ for real dielectric materials. [51]. FDTD simulation of silica nanoparticles of diameter 600 nm in air shows a Q-factor as high as ~3×$10^3$. While the spheres offer high Q values, whispering gallery modes can leak out from the resonator to the outer free space, albeit the leaking takes place at a very low rate (i.e., approximately 10.3% ultralow broadband reflection, representing a ~64% reduction as compared to a solar cell having no light trapping structure) due to the low refractive index of the outer medium (in this case, air). However, titania nanoparticles offering high refractive index of 2.62 in the bottom layer, as well as the direction of light traveling from air toward the silica layer and the titania layer, leads to the formation of leaky channels for light energy from silica nanoparticles thus bringing down the Q-factor of the silica nanoparticles to ~78. The low Q-factor of the silica nanoparticles in the proposed light trapping configuration causes the incident electric field to decay quickly as compared to an array of similarly sized nanoparticles in air, which is depicted in FIG. 8D.

FIG. 3D(ii) shows the inter layer coupling of light from the top layer of silica nanoparticles to the bottom layer of titania nanoparticles at angles of incidence of 0°. The diameter of the bottom layer for titania nanoparticles must be such that it can scatter the in-coupled light, preferentially into the silicon substrate, without any significant back scattering which would result in increased reflection losses. The size parameter of the nanoparticle, given by $$\text{size parameter} = \frac{2\pi \times \text{Radius of sphere}}{\text{Wavelength of interest}}, \quad (5)$$

plays a crucial role in this regard—a size parameter of less than or equal to 1 results in minimal back-scattering. [52]. The total scattering efficiency can be accurately described taking into consideration the effect of the size parameter—the efficiency can be calculated via simulations, as discussed above, or can be calculated via two dimensional analytical functions that depends on the scattering coefficient of the particle and the particle's cross-sectional area. [52]. Therefore, it may seem judicious to choose smaller sized titania nanoparticles. Again, scattering is proportional to the size parameter and, therefore, too small titania nanoparticles (d≤50 nm) leads to an insignificant scattering efficiency resulting in inefficient light trapping inside the active absorber. For high values of nanoparticle diameter (d≥200 nm), not only does the scattering efficiency increase significantly, but so does the size parameter, and, hence the backward scattering.

An optimum scattering efficiency with negligible back scattering needs a size parameter of 0.6-1 in the solar spectrum. [52]. This can be achieved with the use of titania nanoparticles of diameter 100 nm. This also validates the minimum reflection characteristics obtained in the optimization. Finally, FIG. 3D(iii) shows the scattering of light from the bottom layer into the underlying silicon substrate recorded at λ=680 nm.

Figure 3E:
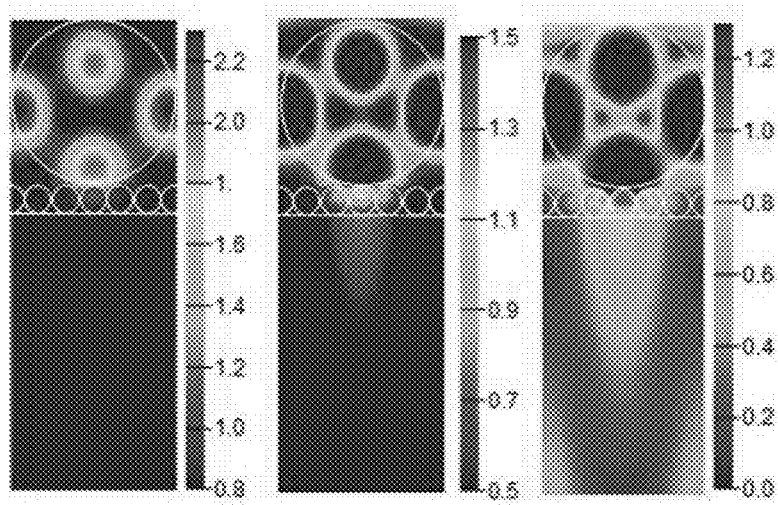
FIG. 3E depicts electric field profiles of the light trapping phenomena for 0° angle of incidence at 570 nm and 900 nm.
Figure 3E:
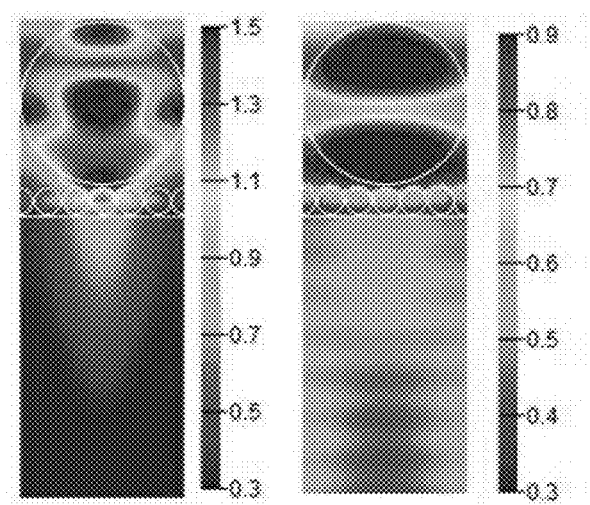
Figure 3F:
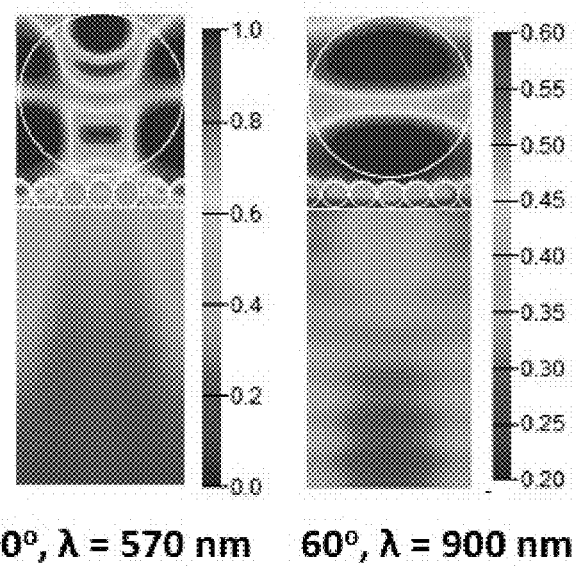
FIG. 3F depicts electric field profiles of the light trapping phenomena for 60° angle of incidence at 570 nm and 900 nm. The outline of the nanoparticles has been marked in white and a silicon absorber thickness of 1 μm has been depicted.
Figure 8E:
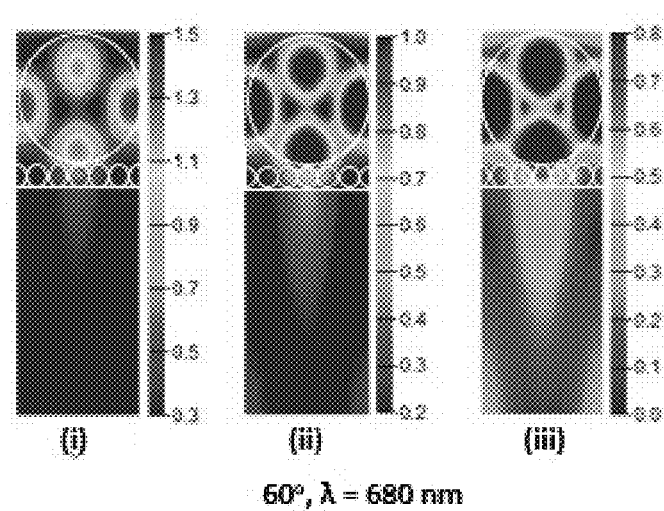
FIG. 8E depicts electric field profiles of the light trapping phenomena shown for an angle of incidence of 60° at 680 nm. Each column of figures corresponds to the advanced light management taking place in the structure itself explaining (i) the formation of whispering gallery modes, (ii) the coupling of light from the top layer to the bottom layer and (iii) the light scattering and focusing of light in the active silicon absorber.
Figure 9:
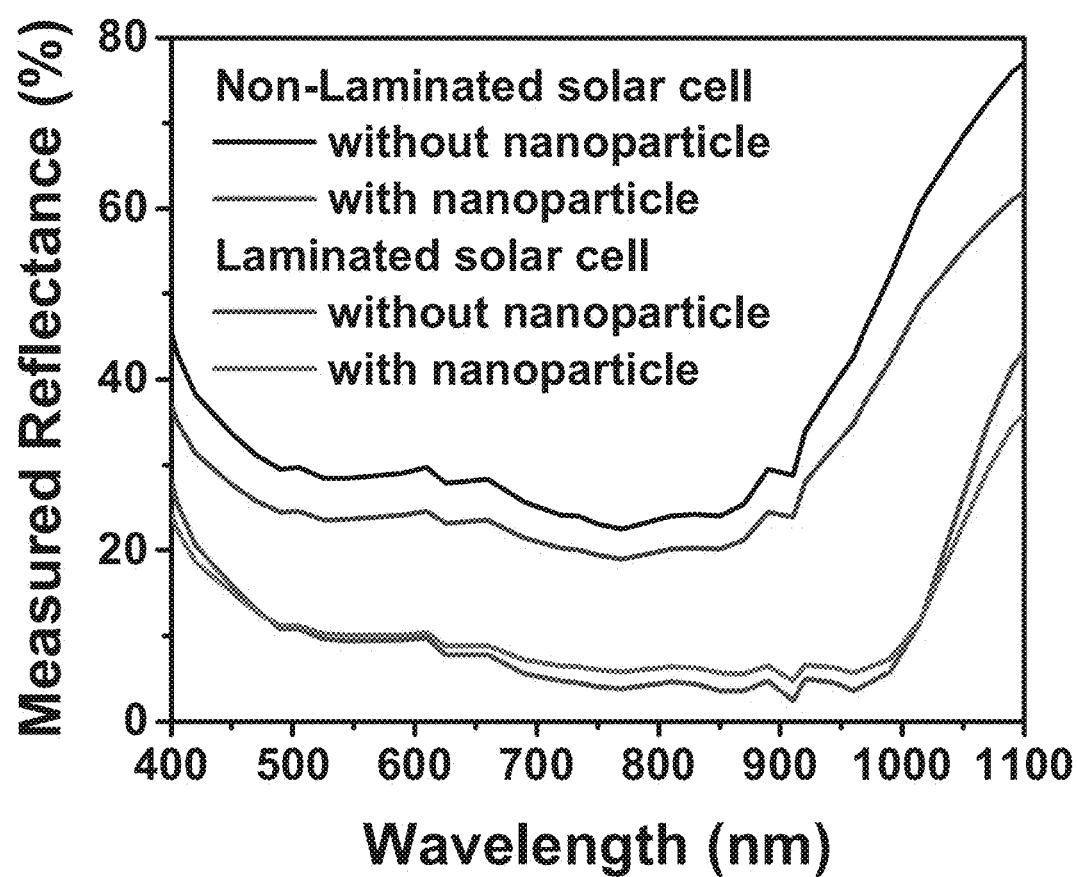
FIG. 9 is a graph depicting a comparison of the reflection characteristics of the fabricated non-laminated and laminated solar cell.

The same optical phenomena have been observed at higher angles of incidence as well. The E-field profiles for a specific case of 60° has been shown in FIG. 8E. All of the light trapping mechanisms observed at 0° incident angle is also present for 60° angle of incidence, which demonstrates the omnidirectional property of the light trapping scheme. Thus, it is seen that the light trapping mechanism of the proposed bilayer scheme exactly mimics the optical behavior of a plant leaf showing lensing, waveguiding, and scattering of light. The effect is not restricted to a particular wavelength. The same effects have been shown at two other wavelengths of 570 nm and 900 nm for normal and non-normal (60°) incidence of light (FIG. 3E-F).

Figure 4A:
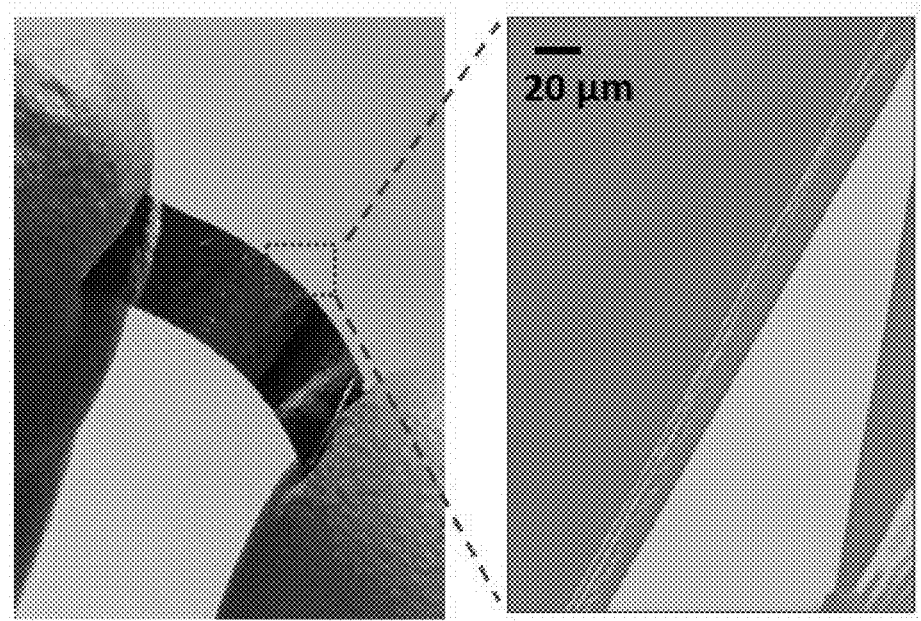
FIG. 4A is a photograph of a flexible and bendable silicon substrate, depicting a scanning electron microscope (SEM) image confirming the thickness of silicon to be 20 μm, with a scale bar of 5 mm.

A simple low-cost colloidal spin coating technique is employed to incorporate non-absorbing, all-dielectric spheroidal nanoparticles as the light trapping scheme on graphene for the fabrication of the flexible ultrathin Gr/Si solar cell. A Flexible silicon substrate of thickness 20±2 μm was obtained from the n-Si substrate having a Miller index of <100> (FIG. 4A). The process, however, can be tuned to achieve another substrate thickness.

Figure 4B:
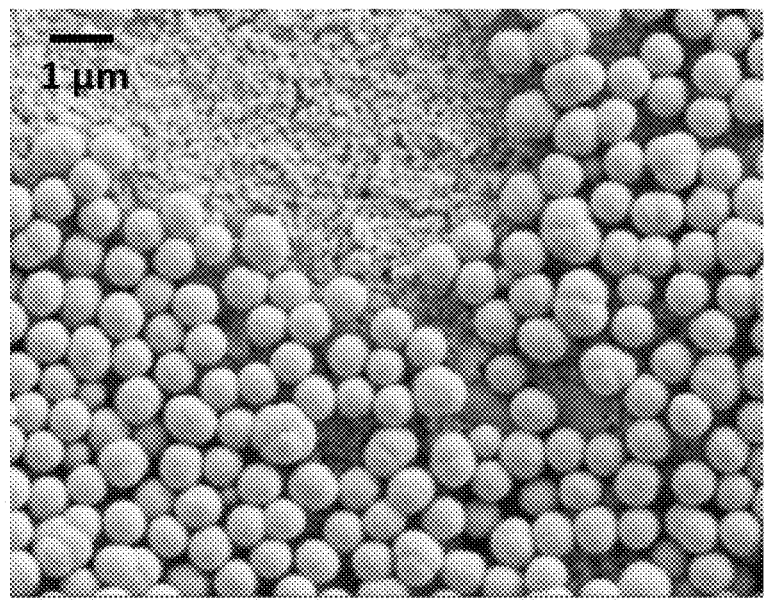
FIG. 4B is a SEM image of the bilayer light trapping scheme with all-dielectric spheres.

A unique methodology of doping the graphene and spin coating the nanoparticles onto the doped graphene on the copper carrier has been demonstrated. This allows for the doped graphene film with the nanoparticles to be transferred onto the flexible silicon substrate having the predefined contacts in a seamless manner. FIG. 4B shows the SEM image of the bilayer nanoparticles (d~120 nm, D~610 nm) on the fabricated device. The process of forming the structure is described herein below.

Typically, doping graphene is performed by providing graphene attached to a copper foil: detaching the graphene from the copper foil via a wet etching technique; transferring the graphene onto a substrate of interest; protecting the graphene with a thin film of an organic solvent, such as poly(methyl methacrylate) (PMMA), which is later removed via acetone; and finally coating or doping the graphene with a chosen substance. However, the use of acetone is not preferred because the solar cell performance that is observed in an acetone-processed solar cell is deficient with respect to the fill factor of the cell, leading to an inefficient cell. As such, the proposed method involves an initial step of coating the graphene, while attached to the copper foil, with a gold chloride solution for doping the graphene. The doped/coated graphene is then coated with titania nanoparticles, and subsequently with the silica nanoparticles. The graphene is then coated with PMMA, and undergoes the wet etching steps to be transferred onto the silicon substrate. Finally, the PMMA is stripped off the graphene by forming a gas anneal in a furnace with gas mixtures of $H_2N_2$, yielding the structure discussed in detail above. [63]. The gas annealing formed in the method also improves the quality of the Schottky junction between the graphene and silicon layers. Moreover, the coating steps performed in the method prior to coating the substrate with PMMA provides for control over the nanoparticle bilayer, particularly the desired diametric ratios for the nanoparticle layers within the bilayer.

Figure 4C:
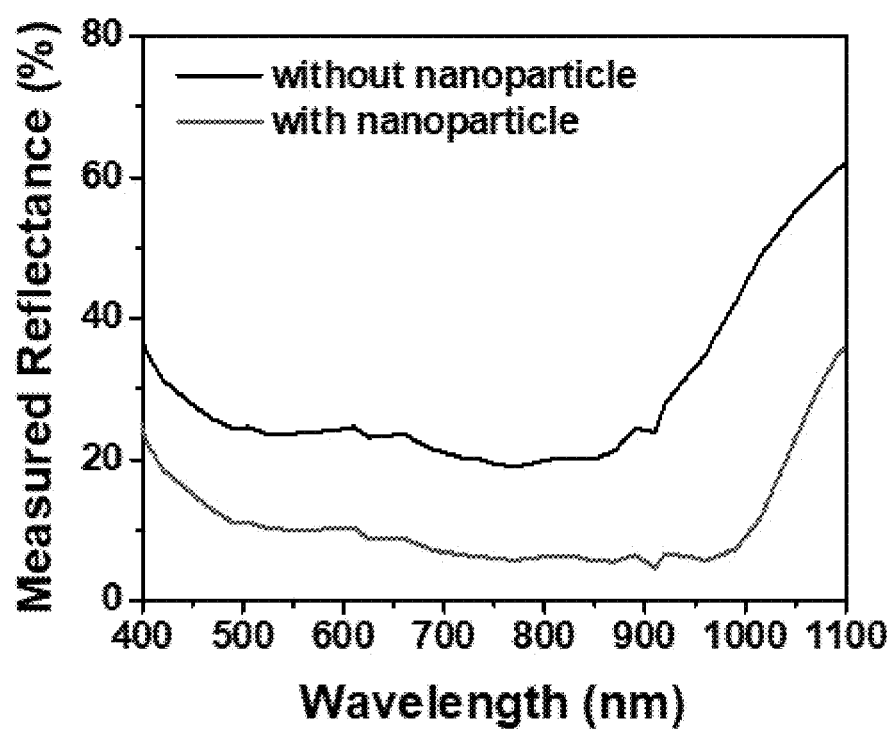
FIG. 4C is a graph of experimentally measured reflectance spectra. The measurements of the device having no light trapping scheme are also shown in the plots for comparison.

Solar cell characteristics of the fabricated laminated devices are shown in FIGS. 4C-4F. The measured reflectance for the synthesized nanoparticle combination on Gr/Si solar cell is shown in FIG. 4C. The integrated reflectance after incorporating the light trapping scheme is ~10.3%, which is a ~64% reduction in the integrated reflectance compared to a bare Gr/Si surface ($R_{int}$=~28.3%). The reflectance of the solar cell without light trapping scheme maintains a broadband response until the response starts rising at wavelengths higher than 900 nm. However, the reflectance of the nanoparticle-incorporated solar cells shows an almost flat response up to the wavelength of 1000 nm and then rises slowly at wavelengths beyond that. The reflectance increasing at higher wavelengths clearly depicts the signature of a thin silicon substrate.

To evaluate the effect of lamination on reflection loss, the comparison of the reflectance of the fabricated non-laminated device with the laminated device is shown in FIG. 8. It is seen that the effect of lamination is more pronounced for a bare Gr/Si interface. The reason can be attributed to the fact that the lamination sheet balances the refractive index mismatch between silicon and air with an intermediate refractive index. However, for the light trapping scheme of the present invention, the top layer of silica nanoparticles offers a refractive index very close to that of the lamination sheet. Therefore, the reflection characteristics of a laminated solar cell with the light trapping scheme varies marginally from that of a non-laminated device.

Figure 4D:
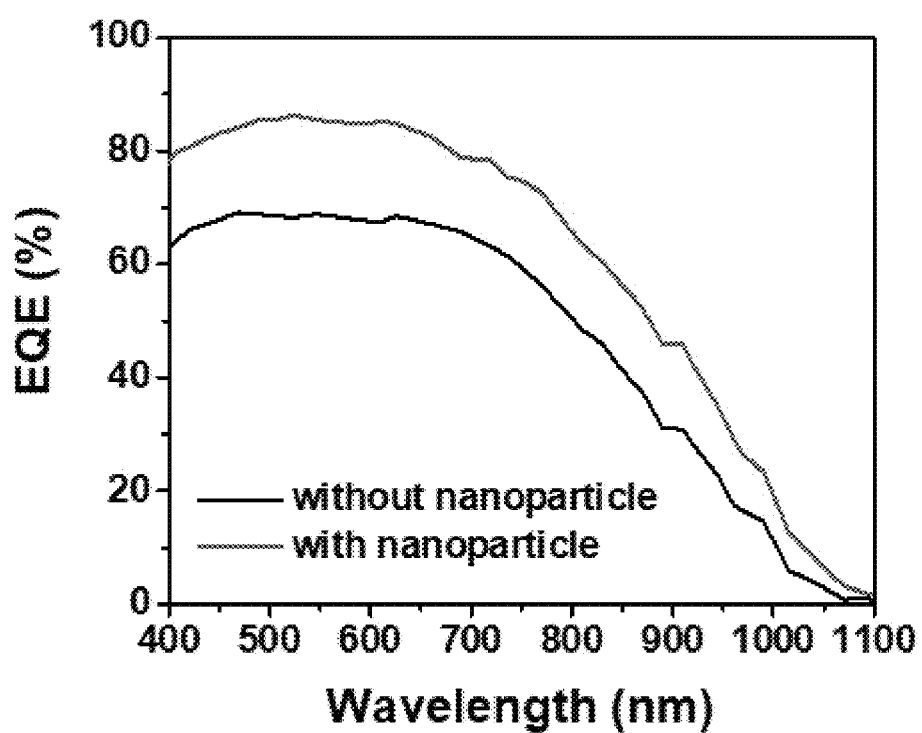
FIG. 4D is a graph of external quantum efficiency vs. wavelength. The measurements of the device having no light trapping scheme are also shown in the plots for comparison.
Figure 10A:
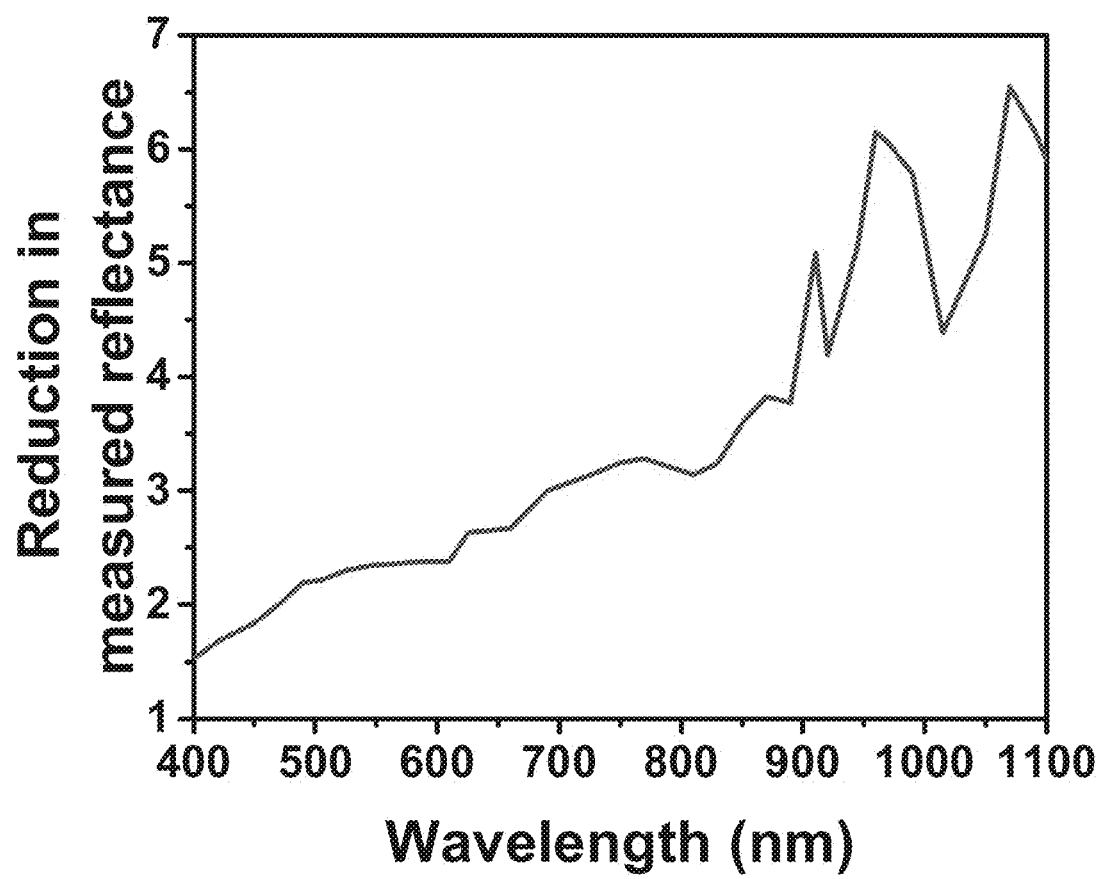
FIG. 10A is a plot of the fractional decrease in reflectance (calculated via the formula $R_{with\_light\_trapping}/R_{without\_light\_trapping}$) as a function of wavelength for the light trapping scheme of the present invention.
Figure 10B:
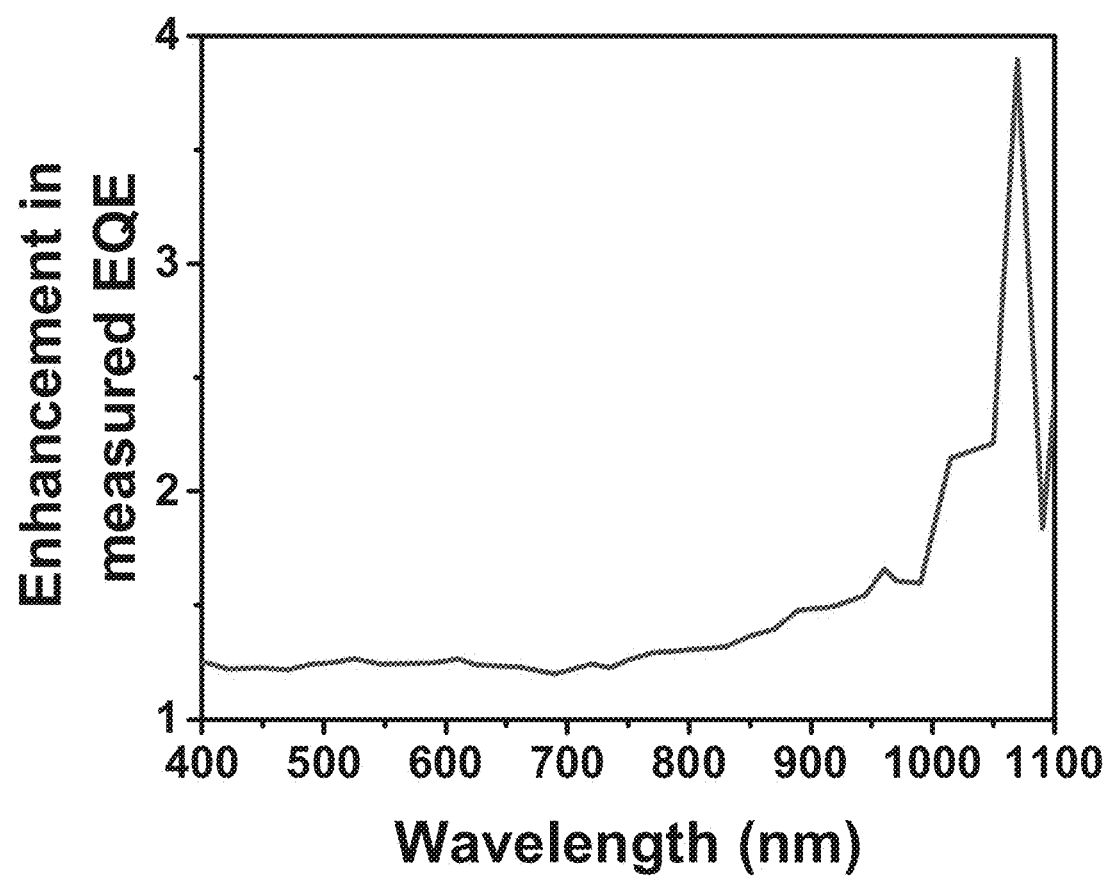
FIG. 10B is a plot of the fractional increase in external quantum efficiency (calculated via the formula $EQE_{with\_light\_trapping}/EQE_{without\_light\_trapping}$) as a function of wavelength for the light trapping scheme of the present invention.

The external quantum efficiency (EQE) of the device due to the incorporation of the nanoparticles with respect to the bare Gr/Si solar cell is plotted in FIG. 4D. The EQE increases by ~30% for the entire solar spectrum of wavelengths 400-1100 nm. Comparing the reduction in measured reflectance and enhancement in measured EQE because of the effect of nanoparticles, it can be concluded that the trends found in both the plots are quite similar, which is depicted in FIGS. 10A-10B. This clearly explains the advanced light management which is taking place over the entire solar spectrum of 400-1100 nm having a predominant behavior at higher wavelengths. To estimate the current density from EQE measurements, the spectral response is integrated over the solar spectrum of 400-1100 nm, as per equation (6):

$$J_{sc} = q \int_{400\,nm}^{1100\,nm} N_0(\lambda) \times EQE(\lambda) d\lambda \quad (6)$$

where $J_{sc}$ is the current, q is the elementary charge, and $N_0(\lambda)$ is the number of photons for the incident AM1.5G solar spectrum. This corresponds to a current density of 20.7 mA/cm² for the solar cell without the light trapping scheme, and 26.8 mA/cm² for the solar cell with the light trapping scheme.

Figure 4E:
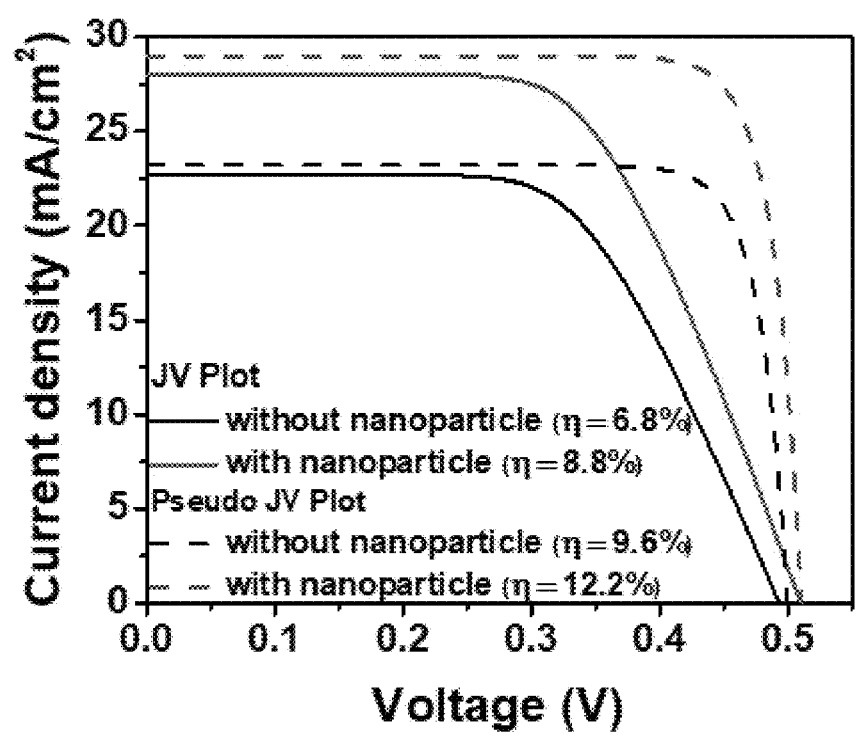
FIG. 4E is a graph of current density vs. voltage (J-V) plot and pseudo J-V plot of the final fabricated device. The measurements of the device having no light trapping scheme are also shown in the plots for comparison.

The solar cell J-V characteristics are shown in FIG. 4E. The Gr/Si solar cell without nanoparticle exhibits an efficiency of 6.8% with $J_{sc}$ of 22.8 mA/cm², $V_{oc}$ of 0.49 V, and FF of 61%. Series and shunt resistance obtained from the slope of the J-V plot at the open circuit voltage and short circuit current point are 5.4 Ωcm² and 100 kΩcm², respectively. Due to the incorporation of the light trapping scheme the PCE and the $J_{sc}$ values reached 8.8% and 28 mA/cm², respectively, with no change in FF and a negligible variation in $V_{oc}$ (an increase of ~4%, attributable to its logarithmic dependence on the current density, making the variation less pronounced). There is also negligible change in the series and shunt resistance. The increase in the $J_{sc}$ is attributed to the strong coupling of incident light enabled by the bilayer nanoparticle coating. Further, it is observed that the estimated current density values from the EQE measurements are in close agreement with the current densities obtained from the J-V measurement under AM1.5G solar illumination. The slight under-prediction of the short-circuit current from the EQE measurements is because the standard solar spectrum extends into deep UV and far IR wavelengths, which is not considered in the EQE measurement (limited to the solar spectrum of 400-1100 nm).

FIG. 4E also shows the measured pseudo J-V characteristics of the solar cells. The pseudo J-V curves show a little difference as compared to the real J-V plot other than the FF. The current ($J_{sc}$) and voltage ($V_{oc}$) points have negligible changes. The FF of the pseudo J-V plot comes around 84% as compared to 61% obtained from the real J-V plot. As observed from the pattern of the plots, it can be concluded that the cell is not significantly impacted by shunting, and that the series resistance is the major cause of FF loss. To evaluate the omnidirectional performance of the proposed devices, device performances were compared for different angles of incidence from 0° to 60°.

Figure 4F:
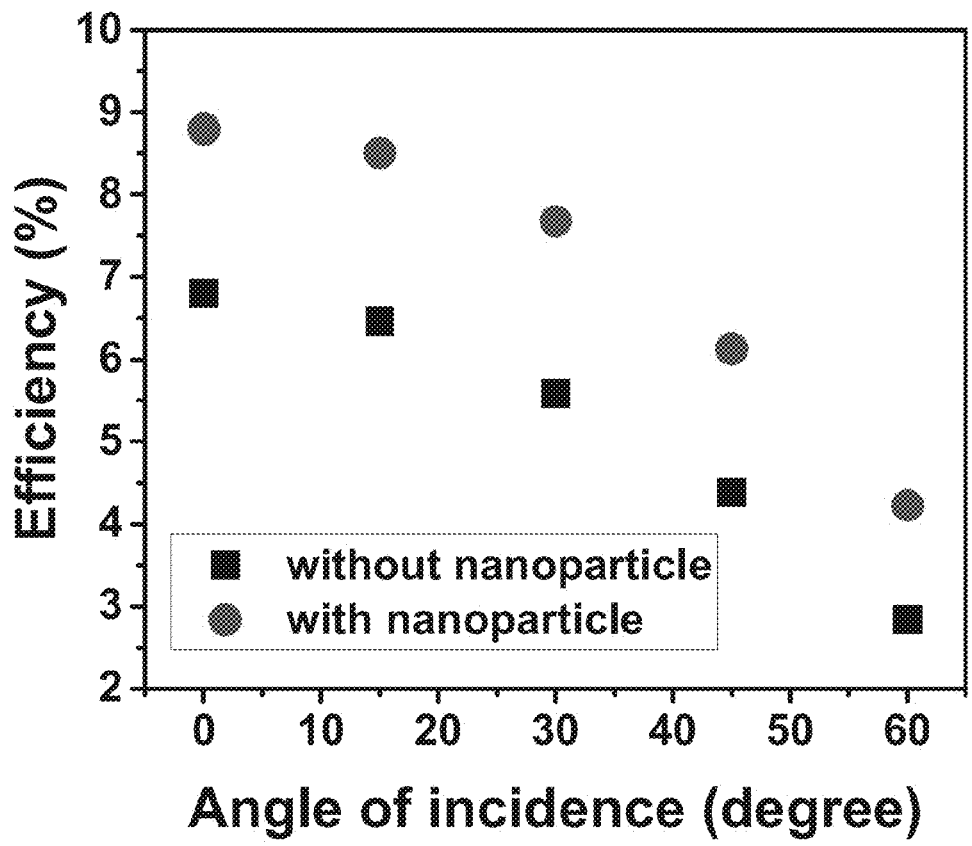
FIG. 4F is a graph of experimentally measured angle dependent efficiency of the final fabricated device. The measurements of the device having no light trapping scheme are also shown in the plots for comparison.
Figure 10C:
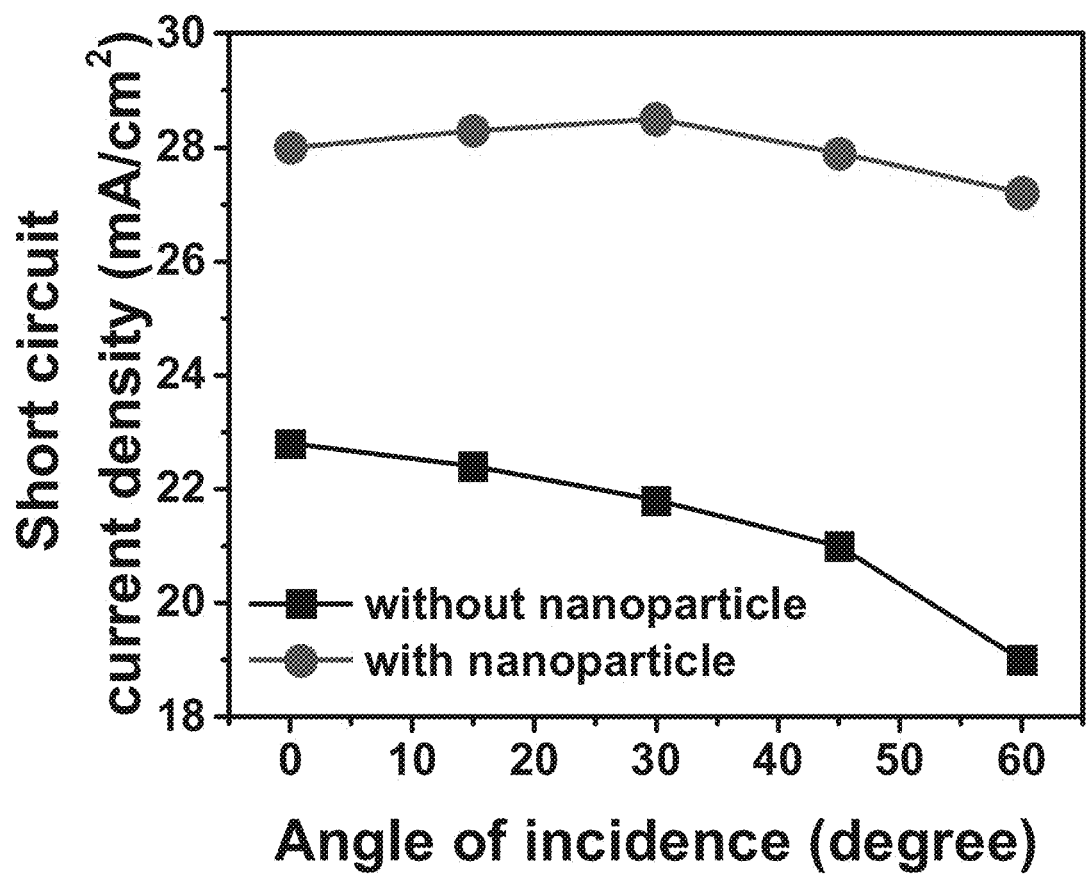
FIG. 10C is a plot of the cosine effect normalized short circuit current density as a function of angles of incidence for the bare Gr/Si and light trapping scheme incorporated Gr/Si solar cell.

FIG. 4F shows the angular efficiency response of the fabricated devices. The efficiency decreases for increased angles of incidence due to the cosine effect of the incident light. The short circuit current density normalized with respect to the cosine effect is shown as a function of angles of incidence in FIG. 10C. It is seen that the bioinspired solar cell shows minimal deviation (a relative change of ~3%) of the current density at wider angles of incidence (0° to 60°) as compared with the bare Gr/Si solar cell (in which the variation is 16% for the minimum and maximum angles of incidence, 0° to 60°). These observations establish that the bilayer nanoparticle light trapping scheme is an omnidirectional layer. Further, the obtained power conversion efficiency in a substrate thickness of 20 μm translates to enormous material cost savings which results in highest Watt/gram silicon utilization of 1.89 as compared to other reported works (references [57]-[60]) as provided below in Table 1.

TABLE 1

| Source | Thickness of silicon (μm) | Maximum power point (mW/cm²) | Watt/ gram | Gram/ Watt |
|---|---|---|---|---|
| [57] | 200 | 32 | 0.69 | 1.45 |
| [58] | 200 | 15.6 | 0.335 | 2.9 |
|  | 180 | 15.6 | 0.38 | 2.63 |
| [59] | 40 | 5.06 (pristine) | 0.543 | 1.8 |
|  | 40 | 8.26 (doped) | 0.887 | 1.13 |
| [60] | 35 | 7.4 | 0.9 | 1.11 |
| [59] | 20 | 3.45 (pristine) | 0.74 | 1.35 |
|  | 20 | 5.34 (doped) | 1.1 | 0.9 |
| Control (device without light trapping scheme of the present invention) | 20 | 6.8 | 1.46 | 0.69 |
| Embodiment of present invention (with light trapping scheme) | 20 | 8.8 | 1.89 | 0.53 |
| [59] | 10 | 1.96 (pristine) | 0.84 | 1.2 |
|  | 10 | 2.92 (doped) | 1.2 | 0.8 |

For the table above, the Watt/gram of the fabricated device was estimated using the following equation:

$$W_g = \frac{\text{Power produced by the solar cell}}{\text{Mass of the solar cell}} = \frac{\text{Power produced per unit area}}{\text{Density of silicon} \times \text{Thickness of substrate}} \quad (7)$$

Figure 11:
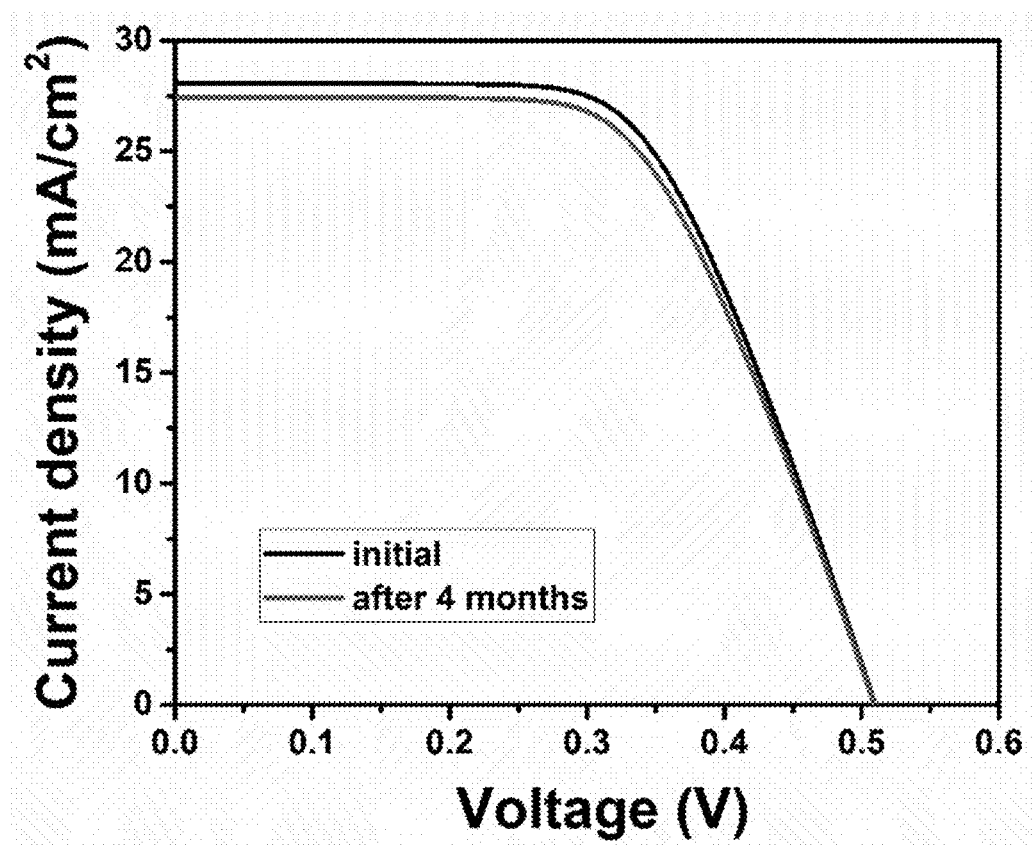
FIG. 11 is a plot of the current density vs. voltage (J-V) for the graphene/silicon solar cell measured just after fabrication and after 4 months.

The data also implies that only 0.53 g of active material is needed to produce power output of 1 W from such devices, and the highest solar cell efficiency was shown to be 8.8% with the proposed light trapping scheme. As sheen in Table 1, the fabrication process flow is repeatable and producible, and that PCE values are highly consistent with a tight PCE distribution (~3% relative change). To investigate the stability in the reported efficiency of the solar cell and aging effect of the solar cell, the cell is examined (FIG. 11) and found to show stable performance after a period of four months, retaining ~96% of the initial PCE without deterioration of the key photovoltaic properties (i.e., $J_{sc}$, $V_{oc}$, and FF).

Figure 5A:
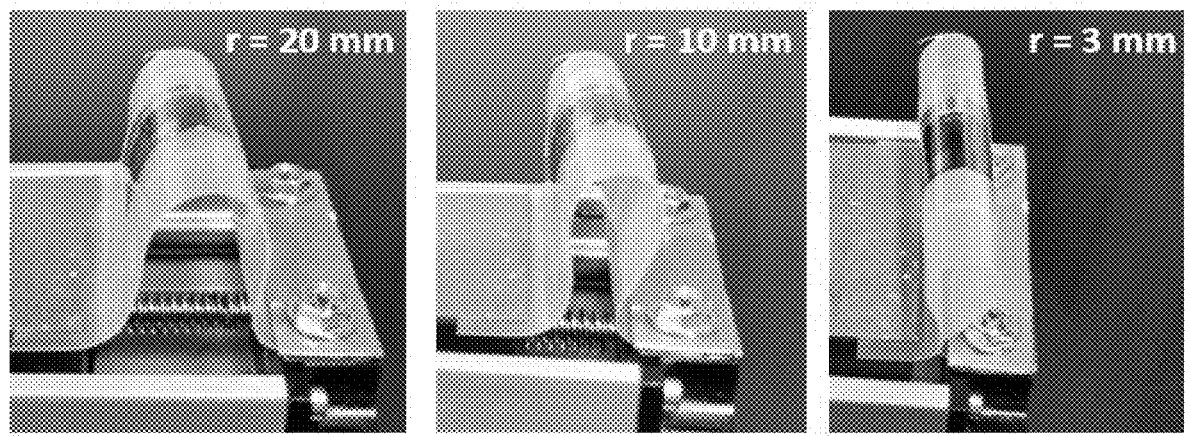
FIG. 5A is a photograph of the solar cell under different bending conditions with various radius of curvature.
Figure 5B:
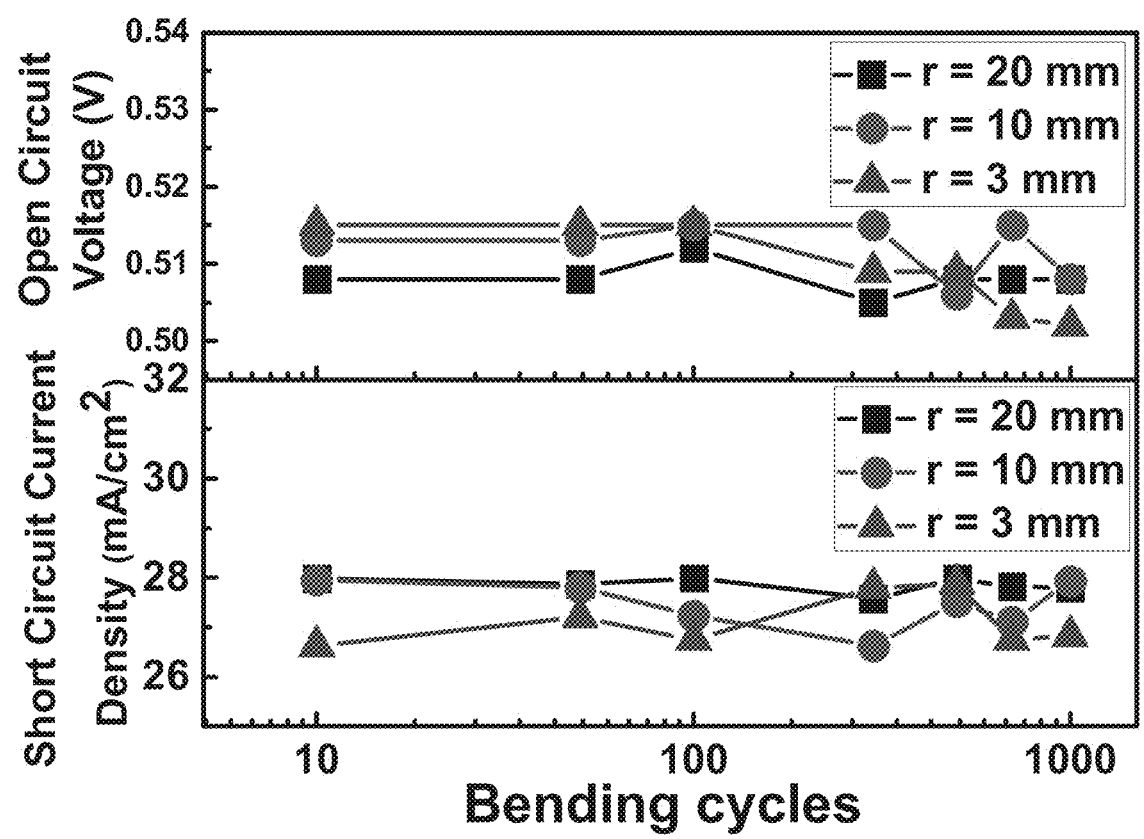
FIG. 5B is a graph showing the dependence of the open circuit voltage and the short circuit current density.
Figure 5C:
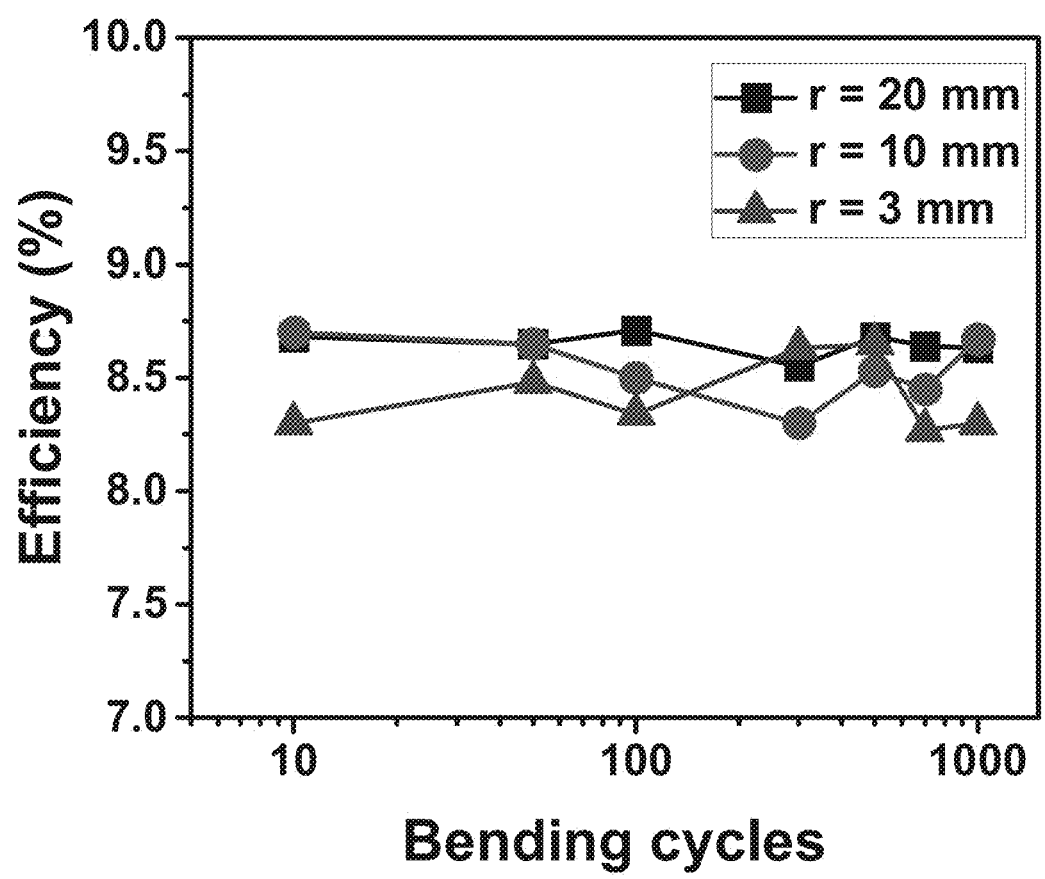
FIG. 5C is a graph of efficiency on different bending cycles.

To demonstrate the flexibility and reliability of the fabricated solar cell with light trapping scheme, the Gr/Si solar cell have been subjected to bending at fixed bending radius of 20 mm, 10 mm and 3 mm (FIG. 5A). Solar J-V characteristics were measured after certain intervals ($10^{th}$, $50^{th}$, $100^{th}$, $300^{th}$, $500^{th}$, $700^{th}$, and $1000^{th}$ cycle) by repeating the bending-recovering cycles. FIG. 5B represents the variation in $J_{sc}$ and $V_{oc}$ due to bending. The variation in $V_{oc}$ is found to be within the range of 0.51 V to 0.50 V while $J_{sc}$ varies between 26 mA/cm² to 28 mA/cm². As a result, the PCE is also found to fluctuate from 8.8% to 8.3% for bend radius of 20 mm, 10 mm and 3 mm, indicative that the device is capable of retaining ~95% of its original performance even after bending over $10^3$ bending cycles of varying radii. The results demonstrate the excellent flexibility as well as high durability of the fabricated solar cells.

In summary, the fabricated Gr/Si heterojunction solar cell on planar 20 μm ultrathin silicon substrate with a leaf inspired biomimetic light trapping scheme has an efficiency of ~9%. The novel scheme involves the use of two optically tuned lossless nanoparticle layers. The nanoparticles in the top silica layer behave as low-Q whispering gallery mode resonators, which confine light and direct it into the bottom titania layer through strong energy leakage channels. The bottom layer subsequently scatters the coupled light into the high index silicon absorber. The light trapping phenomenon is maximized when the particle diameter of the top layer is within 600 nm, and a ratio of 6:1 is maintained between the diameters of the top and bottom layer of nanoparticles. A 30% enhancement in the EQE is achieved due to the nanoparticle coating. The measured PCE of the nanoparticle-coated Gr/Si solar cells for varying angles of incidence confirms the omnidirectional behavior of the solar cell, enabled by the intra-layer and inter-layer nanoparticle interactions. Moreover, the all-dielectric light trapping scheme does not increase surface recombination, establishing its advantages over conventional light trapping schemes, such as nanostructuring of active absorber substrate. The experimentation demonstrates that graphene may be seamlessly integrated into the technology roadmap of monocrystalline silicon solar cells with simple low-cost light trapping schemes which do not offset the optical gain by electrical losses. Further, the fabricated solar cells exhibit highly reliable behavior for $10^3$ bending cycles for bend radii of 20 mm, 10 mm and 3 mm. This validates the capability of the devices as future solar cell technologies since next generation solar cells should be low-cost, flexible and can be fabricated by roll-to-roll processing.

Experimental Section

Optical Simulation:

A three-dimensional full wave FDTD simulation (Lumerical Solution. Inc.) is used to optimize the light trapping scheme for the Gr/Si interface. We have considered bilayer Gr on planar Si. The material properties of Si were taken from the database of Palik [53] in the FDTD simulator and constant refractive indices were used for $SiO_2$ (n=1.46) and $TiO_2$ (n=2.62). A 2D rectangle sheet is used to model the graphene sheet based on the surface conductivity of graphene. [54]. To simulate a bilayer graphene, graphene model with conductivity scaling of 2 was considered. [55]. A simulation box was defined across the size of a unit cell with symmetric/antisymmetric boundaries in the lateral direction and perfectly matched layers in vertical direction. An aluminum back reflector was used to define the bottom boundary condition. A planar wave source having the spectrum range of 400-1000 nm was considered for simulation. Power monitors are placed above the source to capture the wavelength dependent reflection. Moreover, the structure was analyzed by oblique incident plane waves using Broadband Fixed Angle Source Technique sources to simulate its response for varying angles of incidence.

Simulations were performed for both TM and TE polarized light and were averaged out to obtain the total reflection loss for various angles of incidence. Electric field profiles for each wavelength were recorded with frequency domain field profile monitors. For simulating the Q-factor for the structure, time monitors were placed at different locations in the simulation box to isolate the resonant peaks. The quality factor is quantified from the slope of the envelope of the decaying signal by the formula [55]

$$Q = -\frac{2\pi \times \text{resonant frequency} \times \log_{10}^e}{2 \times \text{Slope of the time signal decay}} \tag{8}$$

Nanoparticle Synthesis:

Both silica and titania nanoparticles were synthesized by the well-known Stober method by the hydrolysis and subsequent condensation of alkyl silicate (Tetra Ethyl Ortho Silicate) and alkyl titanate (Titanium Isopropoxide) respectively at room temperature. Ammonium hydroxide was added as a catalyst in the reaction to maintain the desired alkalinity of both the solution. While silica nanoparticles were prepared in a medium of ethanol and water at a stirring speed of 1000 rpm, titania nanoparticles were prepared only in a water medium at 2000 rpm. Finally, the prepared solution was centrifuged to obtain the final colloidal solution. The concentration of the reaction mixture, stirring speed, and time of the reaction were optimized to obtain the desired diameter of nanoparticles. The synthesized nanoparticles were spin-coated on doped graphene to form a monolayer hexagonal close packing array.

Device Fabrication:

To fabricate the Gr/Si heterojunction Schottky type solar cell, n-type Czochralski silicon wafers (<100>, 1-20 Ωcm, 180-200 μm thick) was immersed into 30 wt % KOH solutions heated at 90° C. By controlling the etching duration time, ultrathin Si substrates 20 μm thick were obtained. The wafers were cleaned in a 10% aqueous HF solution at room temperature to get rid of any of native oxide form the surface. Aluminum (100 nm) was deposited by electron beam evaporation to form the back contact of the solar cell. An interfacial oxide layer of $Al_2O_3$ (1 nm) was deposited by atomic layer deposition at 250° C. using tri-methyl Al (TMA) as Al precursor and $H_2O$ as oxygen precursor using an atomic layer deposition system (Savannah, Ultratech/CNT) at a pulsed sequence of (0.015-4-0.015-4) s with 80 sccm carrier gas flow, and 200 mTorr pressure. A masked deposition of the insulating layer of $SiO_2$ (300 nm) was done in PECVD system at a temperature of 250° C. by using a PECVD system (PlasmaTherm 790™) with 200 sccm $SiH_4$, 412 sccm $N_2O$, 1050 mTorr pressure, 25 W rf power and deposition rate of 48-50 nm/min. This was followed by masked deposition of nickel to form the top electrode. A Temescal™ e-beam evaporation system (model FC-2000) was used for depositing the top and front electrodes. Bilayer graphene grown on copper foil (purchased from ACS materials) was transferred onto the silicon substrate by polymethyl methacrylate (PMMA) assisted wet transfer process. [56]. Graphene was p-doped and spin-coated with the nanoparticles prior to PMMA coating. Doping was accomplished by spin-casting $AuCl_3$ dissolved (20 mM) in nitromethane at 2000 rpm for 1 min. Spin coating of titania nanoparticles followed by silica nanoparticles were done to obtain a uniform coverage all over the doped graphene. The fabricated Gr/Si devices were finally annealed in a tube furnace with $1:9::H_2:N_2$ at 400° C. for 3 hours to remove the PMMA and for better adhesion of graphene with the substrate. Prior to lamination, long strips of copper tapes with adhesive lining were affixed on to the front and back contacts of the fabricated solar cell. For lamination, the front side of the solar cell was placed face down onto a 25 µm thin Polyethylene terephthalate (PET) sheet. The self-seal laminating layers with adhesive lining were placed evenly onto the back of solar cell while applying slide downward pressure. The entire device was firmly pressed subsequently to smooth and seal the edges of the lamination without any trapped air bubble.

Material and Device Characterization:

Solar J-V characteristics were measured under one sun illumination using a Keysight™ B1500A Semiconductor Device Analyzer. Solar J-V characteristics were also measured by varying the incident angle of light between 0° and 60°. Experiments on the bending mechanism of the ultrathin flexible solar cells were performed by a simplified motorized motion controller by Zaber Technologies via computer peripheral. External quantum efficiency and reflectance measurements were obtained with a Tau Science FlashQE coupled with an integrated sphere, and both were measured for the wavelength range of 400 nm to 1100 nm. SEM images were taken in Zeiss ULTRA-55 FEG SEM.

REFERENCES

1. Sonntag, P.; Preissler, N.; Bokalič, M.; Trahms, M.; Haschke, J.; Schlatmann, R.; Topič, M.; Rech, B.; Amkreutz, D., Silicon solar cells on glass with power conversion efficiency above 13% at thickness below 15 micrometer. *Sci. Rep.* 2017, 7, 873.
2. Islam, R.; Saraswat, K., Limitation of Optical Enhancement in Ultra-thin Solar Cells Imposed by Contact Selectivity. *Sci. Rep.* 2018, 8, 8863.
3. Roy, A. B.; Dhar, A.; Choudhuri, M.; Das, S.; Hossain, S. M.; Kundu, A., Black silicon solar cell: analysis optimization and evolution towards a thinner and flexible future. *Nanotechnology* 2016, 27, 305302-305302.
4. Yu, X.; Sivula, K., Toward large-area solar energy conversion with semiconducting 2D transition metal dichalcogenides. *ACS Energy Lett.* 2016, 1, 315-322.
5. Lee, J. Y.; Shin, J.-H.; Lee, G.-H.; Lee, C.-H., Two-Dimensional Semiconductor Optoelectronics Based on van der Waals Heterostructures. *Nanomaterials* 2016, 6, 193.
6. Tang, W.; Rassay, S.; Ravindra, N., Electronic & Optical properties of transition-metal dichalcogenides. *Madridge J. Nano. Tech.* 2017, 2, 59-65.
7. Akinwande, D.; Petrone, N.; Hone, J., Two-dimensional flexible nanoelectronics. 2014, 5, 5678.
8. Li, X.; Zhu, H.; Wang, K.; Cao, A.; Wei, J.; Li, C.; Jia, Y.; Li, Z.; Li, X.; Wu, D., Graphene-on-silicon Schottky junction solar cells. *Adv. Mater.* 2010, 22, 2743-2748.
9. Yang, L.; Yu, X.; Hu, W.; Wu, X.; Zhao, Y.; Yang, D., An 8.68% efficiency chemically-doped-free graphene-silicon solar cell using silver nanowires network buried contacts. *ACS Appl. Mater. Interfaces* 2015, 7, 4135-4141.
10. Yu, X.; Yang, L.; Lv, Q.; Xu, M.; Chen, H.; Yang, D., The enhanced efficiency of graphene-silicon solar cells by electric field doping. *Nanoscale* 2015, 7, 7072.
11. Ahn, J.; Chou, H.; Banerjee, S. K., Graphene-$Al_2O_3$-silicon heterojunction solar cells on flexible silicon substrates. *J. Appl. Phys.* 2017, 121, 163105.
12. Ruan, K.; Ding, K.; Wang, Y.; Diao, S.; Shao, Z.; Zhang, X.; Jie, J., Flexible graphene/silicon heterojunction solar cells. *J. Mater. Chem. A* 2015, 3, 14370-14377.
13. Oh, J.; Yuan, H.-C.; Branz, H. M., An 18.2%-efficient black-silicon solar cell achieved through control of carrier recombination in nanostructures. *Nat. Nanotechnol.* 2012, 7, 743.
14. Ye, Y.; Dai, L., Graphene-based Schottky junction solar cells. *J. Mater. Chem.* 2012, 22, 24224-24229.
15. Louwen, A.; Van Sark, W.; Schropp, R.; Faaij, A., A cost roadmap for silicon heterojunction solar cells. *Sol. Energy Mater. Sol. Cells* 2016, 147, 295-314.
16. Kang, J.; Hwang, S.; Kim, J. H.; Kim, M. H.; Ryu, J.; Seo, S. J.; Hong, B. H.; Kim, M. K.; Choi, J.-B., Efficient transfer of large-area graphene films onto rigid substrates by hot pressing. *ACS Nano* 2012, 6, 5360-5365.
17. Bae, S.; Kim, H.; Lee, Y.; Xu, X.; Park, J.-S.; Zheng, Y.; Balakrishnan, J.; Lei, T.; Kim, H. R.; Song, Y. I., Roll-to-roll production of 30-inch graphene films for transparent electrodes. *Nat. Nanotechnol.* 2010, 5, 574-578.
18. Polat, E. O.; Balci, O.; Kakenov, N.; Uzlu, H. B.; Kocabas, C.; Dahiya, R., Synthesis of large area graphene for high performance in flexible optoelectronic devices. *Sci. Rep.* 2015, 5, 16744.
19. Li, X.; Zhu, H., The graphene-semiconductor Schottky junction. *Physics Today* 2016, 69, 46-51.
20. Song, Y.; Li, X.; Mackin, C.; Zhang, X.; Fang, W.; Palacios, T. s.; Zhu, H.; Kong, J., Role of interfacial oxide in high-efficiency graphene-silicon Schottky barrier solar cells. *Nano Lett.* 2015, 15, 2104-2110.
21. Bhushan, B., Biomimetics: lessons from nature—an overview. The Royal Society: 2009.
22. Rahman, A.; Ashraf, A.; Xin, H.; Tong, X.; Sutter, P.; Eisaman, M. D.; Black, C. T., Sub-50-nm self-assembled nanotextures for enhanced broadband antireflection in silicon solar cells. *Nat. Commun.* 2015, 6, 5963.
23. Boden, S. A.; Bagnall, D. M., Optimization of moth-eye antireflection schemes for silicon solar cells. *Progress in Photovoltaics: Research and Applications* 2010, 18, 195-203.
24. Dewan, R.; Fischer, S.; Meyer-Rochow, V. B.; Ozdemir, Y.; Hamraz, S.; Knipp, D., Studying nanostructured nipple arrays of moth eye facets helps to design better thin film solar cells. *Bioinspiration & biomimetics* 2011, 7, 016003.
25. Feng, T.; Xie, D.; Lin, Y.; Zang, Y.; Ren, T.; Song, R.; Zhao, H.; Tian, H.; Li, X.; Zhu, H., Graphene based Schottky junction solar cells on patterned silicon-pillar-array substrate. *Appl. Phys. Lett.* 2011, 99, 233505.
26. Arefinia, Z.; Asgari, A., A new modeling approach for graphene based silicon nanowire Schottky junction solar cells. *Journal of Renewable and Sustainable Energy* 2014, 6, 043132.
27. Diedenhofen, S. L.; Vecchi, G.; Algra, R. E.; Hartsuiker, A.; Muskens, O. L.; Immink, G.; Bakkers, E. P.; Vos, W. L.; Rivas, J. G., Broad-band and Omnidirectional Antireflection Coatings Based on Semiconductor Nanorods. *Adv. Mater.* 2009, 21, 973-978.
28. Nicholl, R. J.; Conley, H. J.; Lavrik, N. V.; Vlassiouk, I.; Puzyrev, Y. S.; Sreenivas, V. P.; Pantelides, S. T.; Bolotin, K. I., The effect of intrinsic crumpling on the mechanics of free-standing graphene. *Nat. Commun.* 2015, 6, 8789.
29. Barnard, A. S.; Snook, I. K., Ripple induced changes in the wavefunction of graphene: an example of a fundamental symmetry breaking. *Nanoscale* 2012, 4, 1167-1170.
30. Park, B.-J.; Choi, J.-S.; Kim, H.-S.; Kim, H.-Y.; Jeong, J.-R.; Choi, H.-J.; Jung, H.-J.; Jung, M.-W.; An, K.-S.; Yoon, S.-G., Realization of large-area wrinkle-free monolayer graphene films transferred to functional substrates. *Sci. Rep.* 2015, 5.
31. Deng, S.; Berry, V., Wrinkled, rippled and crumpled graphene: an overview of formation mechanism, electronic properties, and applications. *Mater. Today* 2016, 19, 197-212.
32. Chen, W.; Gui, X.; Liang, B.; Liu, M.; Lin, Z.; Zhu, Y.; Tang, Z., Controllable fabrication of large-area wrinkled graphene on a solution surface. *ACS Appl. Mater. Interfaces* 2016, 8, 10977-10984.
33. Atwater, H. A.; Polman, A., Plasmonics for improved photovoltaic devices. *Nat. Mater.* 2010, 9, 205.
34. Jahani, S.; Jacob, Z., All-dielectric metamaterials. *Nat. Nanotechnol.* 2016, 11, 23.
35. Grandidier, J.; Callahan, D. M.; Munday, J. N.; Atwater, H. A., Light absorption enhancement in thin-film solar cells using whispering gallery modes in dielectric nanospheres. *Adv. Mater.* 2011, 23, 1272-1276.
36. Yang, Z.; Gao, P.; Zhang, C.; Li, X.; Ye, J., Scattering effect of the high-index dielectric nanospheres for high performance hydrogenated amorphous silicon thin-film solar cells. *Sci. Rep.* 2016, 6.
37. Yao, Y.; Yao, J.; Narasimhan, V. K.; Ruan, Z.; Xie, C.; Fan, S.; Cui, Y., Broadband light management using low-Q whispering gallery modes in spherical nanoshells. *Nat. Commun.* 2012, 3, 664.
38. Parrain, D.; Baker, C.; Wang, G.; Guha, B.; Santos, E. G.; Lemaitre, A.; Senellart, P.; Leo, G.; Ducci, S.; Favero, I., Origin of optical losses in gallium arsenide disk whispering gallery resonators. *Opt. Express* 2015, 23, 19656-19672.
39. Gomilšek, M., Whispering gallery modes. *Univ. Ljubl. Ljubl. Semin* 2011.
40. Ruban, A. V., Plants in light. *Communicative & integrative biology* 2009, 2, 50-55.
41. Vogelman, T. C.; Nishio, J. N.; Smith, W. K., Leaves and light capture: light propagation and gradients of carbon fixation within leaves. *Trends in Plant Science* 1996, 1, 65-70.
42. Ma, K.; Baret, F.; Barroy, P.; Bousquet, L. In *A leaf optical properties model accounting for differences between the two faces*, 10th International Symposium on Physical Measurements and Signatures in Remote Sensing, 2007. ISPMSRS07, Citeseer: 2007.
43. Song, Y.; Li, X.; Mackin, C.; Zhang, X.; Fang, W.; Palacios, T.; Zhu, H.; Kong, J., Role of Interfacial Oxide in High-Efficiency Graphene-Silicon Schottky Barrier Solar Cells. *Nano Lett.* 2015, 15, 2104-2110.
44. https://www.acsmaterial.com/.
45. Suk, J. W.; Kitt, A.; Magnuson, C. W.; Hao, Y.; Ahmed, S.; An, J.; Swan. A. K.; Goldberg, B. B.; Ruoff, R. S., Transfer of CVD-grown monolayer graphene onto arbitrary substrates. *ACS Nano* 2011, 5, 6916-6924.
46. Chen, Z.; Taflove, A.; Backman, V., Highly efficient optical coupling and transport phenomena in chains of dielectric microspheres. *Opt. Lett.* 2006, 31, 389-391.
47. Chiasera, A.; Dumeige, Y.; Feron, P.; Ferrari, M.; Jestin, Y.; Nunzi Conti, G.; Pelli, S.; Soria, S.; Righini, G. C., Spherical whispering-gallery-mode microresonators. *Laser & Photonics Reviews* 2010, 4, 457-482.
48. Righini, G.; Dumeige, Y.; Feron, P.; Ferrari, M.; Nunzi Conti, G.; Ristic, D.; Soria, S., Whispering gallery mode microresonators: fundamentals and applications. *Rivista del Nuovo Cimento* 2011, 34, 435-488.
49. Strekalov, D. V.; Marquardt, C.; Matsko, A. B.; Schwefel, H. G.; Leuchs, G., Nonlinear and quantum optics with whispering gallery resonators. *J. Opt.* 2016, 18, 123002.
50. Kandas, I.; Zhang, B.; Daengngam, C.; Ashry, I., Jao, C.-Y.; Peng, B.; Ozdemir, S. K.; Robinson, H. D.; Heflin, J. R.; Yang, L., High quality factor silica microspheres functionalized with self-assembled nanomaterials. *Optics express* 2013, 21, 20601-20610.
51. Wu, J. H.; Ang, L. K.; Liu, A. Q.; Teo, H. G.; Lu, C., Tunable high-Q photonic-bandgap Fabry-Perot resonator. *JOSA B* 2005, 22, 1770-1777.
52. Luk'yanchuk, B. S.; Voshchinnikov, N. V.; Paniagua-Dominguez, R.; Kuznetsov, A. 1., Optimum forward light scattering by spherical and spheroidal dielectric nanoparticles with high refractive index. *ACS Photonics* 2015, 2, 993-999.
53. Palik, E.; Ghosh, G., Handbook of Optical Constants of Solids (New York: Academic). 1985.
54. Andryieuski, A.; Lavrinenko, A. V., Graphene metamaterials based tunable terahertz absorber: effective surface conductivity approach. *Optics express* 2013, 21, 9144-9155.
55. https://kb.lumerical.com/.
56. Chan, J.; Venugopal, A.; Pirkle, A.; McDonnell, S.; Hinojos, D.; Magnuson, C. W.; Ruoff, R. S.; Colombo, L.; Wallace, R. M.; Vogel, E. M., Reducing extrinsic performance-limiting factors in graphene grown by chemical vapor deposition. *ACS Nano* 2012, 6, 3224-3229.
57. Rühle, S., Tabulated values of the Shockley-Queisser limit for single junction solar cells. *Solar Energy* 2016, 130, 139-147.
58. Song. Y.; Li, X.; Mackin, C.; Zhang, X., Fang, W., Palacios, T.; Zhu, H.; Kong, J., Role of Interfacial Oxide in High-Efficiency Graphene-Silicon Schottky Barrier Solar Cells. *Nano Lett.* 2015, 15, 2104-2110.
59. Ruan, K.; Ding, K.; Wang, Y.; Diao, S.; Shao, Z.; Zhang, X.; Jie, J., Flexible graphene/silicon heterojunction solar cells. *J. Mater. Chem. A* 2015, 3, 14370-14377.

60. Ahn, J.; Chou, H.; Banerjee, S. K., Graphene-Al2O3-silicon heterojunction solar cells on flexible silicon substrates. *J. Appl. Phys.* 2017, 121, 163105.
61. Nasir, M. N. M.; Gorajoobi, S. B.; Murugan, G. S.; Zervas, M. N., editors. Polarization effects in optical resonators. Proceedings of the Photonics Conference (IPC). IEEE. 2015.
62. Han, Y.; Huang, J. A.; Liu, X. Y.; Zhang, X. J.; Shi, J. X.; Yan, C. C. Polarization-independent broadband plasmonic absorber based on a silicon-nanowire array decorated by gold nanoparticles at the optical regime. Opt. Express 24. 2016. 9178-9186.
63. Choi, Y.; Lee, J.; Seo, J.; Jung, S.; Kim, U.; Park, H. The effect of the graphene integration process on the performance of graphene-based Schottky junction solar cells. Journal of Materials Chemistry A. 5(35). 2017. 18716-18724.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A synergistic lossless omnidirectional light trapping scheme for a heterojunction photovoltaic cell for solar energy capture within the solar spectrum that receives light across normal angles of incidence, oblique angles of incidence, or both, the synergistic lossless omnidirectional light trapping scheme for the heterojunction photovoltaic cell comprising:
   an inorganic bilayer configuration of densely packed hexagonal arrays of nanoparticles, each nanoparticle of the hexagonal arrays being in physical contact with at least one alternative nanoparticle of the hexagonal arrays, the bilayer configuration including:
      a top optically tuned layer in contact with a bottom optically tuned layer, the top optically tuned layer comprised of a plurality of nonmetallic all-dielectric silica nanospheres, each of the plurality of nonmetallic all-dielectric silica nanospheres having a first diameter associated therewith; and
      the bottom optically tuned layer disposed beneath the top optically tuned layer, the bottom optically tuned layer comprised of a plurality of nonmetallic all-dielectric titania nanospheres, each of the plurality of nonmetallic all-dielectric titania nanospheres having a second diameter associated therewith, the second diameter being smaller than the first diameter;
   wherein the top optically tuned layer is configured to capture and funnel an incident light into the bottom optically tuned layer with reduced refractory loss;
   wherein subsequent to the incident light being captured by the top optically tuned layer, the incident light is configured to strike an internal surface of at least one of the plurality of nonmetallic all-dielectric silica nanospheres at an angle of at least 43°, whereby the incident light becomes reflected light as the reflected light contacts and travels on inner edges of the internal surface of the at least one of the plurality of nonmetallic all-dielectric silica nanospheres, such that a total internal reflection exists between the top optically tuned layer and an exterior air environment for normal angles of incidence, oblique angles of incidence, or both; and
   wherein the bottom optically tuned layer is adapted to receive the reflected light from the at least one of the plurality of nonmetallic all-dielectric silica nanospheres and scatter the reflected light in a direction away from the top optically tuned layer and toward a substrate, whereby a back-scattering of the reflected light is minimized, thereby optimizing a photo-conversion efficiency.

2. The synergistic lossless omnidirectional light trapping scheme of claim 1, wherein the second diameter is less than half the size of the first diameter.

3. The synergistic lossless omnidirectional light trapping scheme of claim 1, wherein a ratio of the first diameter to the second diameter is approximately 6:1.

4. The synergistic lossless omnidirectional light trapping scheme of claim 1, wherein the substrate has a height of approximately 20 µm.

5. A heterojunction photovoltaic cell comprising:
   a substrate including a planar silicon surface passivated by a layer of aluminum oxide, a layer of graphene film that is p-doped with gold trichloride coating the planar silicon surface, with the substrate disposed beneath and in contact with a bottom optically tuned layer;
   an omnidirectional light trapping scheme comprising:
   an inorganic bilayer configuration of densely packed hexagonal arrays of nanoparticles, each nanoparticle of the hexagonal arrays being in physical contact with at least one alternative nanoparticle of the hexagonal arrays, the bilayer configuration including:
      a top optically tuned layer in contact with the bottom optically tuned layer, the top optically tuned layer comprised of a plurality of nonmetallic all-dielectric silica nanospheres, each of the plurality of nonmetallic all-dielectric silica nanospheres having an associated diameter; and
      the bottom optically tuned layer disposed beneath the top optically tuned layer, the bottom optically tuned layer comprised of a plurality of nonmetallic all-dielectric titania nanospheres, each of the plurality of nonmetallic all-dielectric titania nanospheres having an associated diameter smaller than the associated diameter of each of the plurality of all-dielectric silica nanospheres,
   wherein the top optically tuned layer is configured to capture and funnel an incident light into the bottom optically tuned layer with reduced refractory loss; and
   wherein the bottom optically tuned layer is adapted to receive the incident light from the at least one of the plurality of nonmetallic all-dielectric silica nanospheres and scatter the incident light in a direction away from the top optically tuned layer and toward the substrate,
   whereby a back-scattering of the reflected light is minimized, thereby optimizing a photo-conversion efficiency.

6. The photovoltaic cell of claim 5, wherein whispering gallery modes are formed within the top optically tuned layer to direct light into the bottom optically tuned layer with reduced refractory loss.

7. The heterojunction photovoltaic cell of claim 5, wherein the second diameter is less than half the size of the first diameter.

8. The heterojunction photovoltaic cell of claim 5, wherein a ratio of the first diameter to the second diameter is approximately 6:1.

9. The heterojunction photovoltaic cell of claim 5, wherein the layer of aluminum oxide is amorphous.

10. The heterojunction photovoltaic cell of claim 5, wherein the substrate has a height of approximately 20 µm.

11. A synergistic method of capturing light in a heterojunction photovoltaic cell comprising an omnidirectional light trapping scheme, the method comprising the steps of:
- coating a graphene bilayer with an amount of gold chloride to dope the graphene bilayer;
- spin-coating a plurality of nonmetallic all-dielectric titania nanospheres onto the doped graphene bilayer;
- spin-coating a plurality of nonmetallic all-dielectric silica nanospheres onto the doped graphene bilayer including the nonmetallic dielectric titania nanospheres, forming a bilayer configuration of densely packed hexagonal arrays of nanospheres;
- wet etching the doped graphene bilayer including the nonmetallic all-dielectric titania nanospheres disposed beneath the nonmetallic dielectric silica nanospheres, wherein each nanosphere of the plurality of silica nanospheres, the plurality of titania nanosphere, or both are in physical contact with at least one alternative silica nanosphere, titania nanosphere, or both;
- transferring the doped graphene bilayer onto a silicon substrate to form the heterojunction photovoltaic cell;
- receiving and capturing an amount of light within the nonmetallic all-dielectric silica nanospheres;
- directing a portion of the amount of light into the nonmetallic all-dielectric titania nanospheres by forming whispering gallery modes within the nonmetallic all-dielectric silica nanoparticles, thereby reducing refraction loss; and
- directing the portion of the amount of light into the heterojunction photovoltaic cell.

12. The synergistic lossless omnidirectional light trapping scheme of claim 1, wherein the inorganic omnidirectional bilayer configuration is configured to receive light having an angle of incidence of 0° to at most 60°.

13. The synergistic lossless omnidirectional light trapping scheme of claim 1, wherein the reflected light is broadband in nature, whereby a reflectance of the light trapping scheme is at most 3% for a light spectrum ranging from at least 540 nm to at most 740 nm.

14. The synergistic lossless omnidirectional light trapping scheme of claim 1, wherein the titania nanosphere comprises a diameter of at least 100 nm.

15. The synergistic lossless omnidirectional light trapping scheme of claim 1, wherein the photovoltaic cell comprises a conversion efficiency of at least 9%.

16. The synergistic lossless omnidirectional light trapping scheme of claim 15, wherein, subsequent to bending over at least $10^3$ bending cycles, the photovoltaic cell retains at least 95% of the conversion efficiency.

\* \* \* \* \*